(12) United States Patent
Lee et al.

(10) Patent No.: US 12,185,607 B2
(45) Date of Patent: Dec. 31, 2024

(54) DISPLAY DEVICE

(71) Applicant: Samsung Display Co., Ltd., Yongin-si (KR)

(72) Inventors: Hang Jae Lee, Yongin-si (KR); Sang Hoon Park, Seongnam-si (KR); Sung Jae Yun, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 661 days.

(21) Appl. No.: 17/445,796

(22) Filed: Aug. 24, 2021

(65) Prior Publication Data
US 2022/0077245 A1   Mar. 10, 2022

(30) Foreign Application Priority Data

Sep. 9, 2020 (KR) .......................... 10-2020-0115273

(51) Int. Cl.
*H10K 59/35* (2023.01)
*H10K 59/121* (2023.01)

(52) U.S. Cl.
CPC ......... *H10K 59/353* (2023.02); *H10K 59/121* (2023.02)

(58) Field of Classification Search
CPC ............................................ H10K 50/805–826
See application file for complete search history.

(56) References Cited

U.S. PATENT DOCUMENTS

| 11,967,607 | B2* | 4/2024 | Do ........................... H01L 33/44 |
| 2019/0043842 | A1 | 2/2019 | Guo et al. |
| 2020/0273397 | A1 | 8/2020 | Jeong et al. |
| 2021/0090492 | A1 | 3/2021 | Morita et al. |
| 2021/0143373 | A1* | 5/2021 | Kim ................. H10K 59/80524 |

FOREIGN PATENT DOCUMENTS

| KR | 10-1429095 B1 | 8/2014 |
| KR | 10-2017-0139355 A | 12/2017 |
| WO | WO 2019/235147 A1 | 12/2019 |
| WO | WO 2020/0149475 A1 | 7/2020 |

OTHER PUBLICATIONS

Extended European Search Report dated Feb. 7, 2022 for corresponding European Application No. 21194153.9 (6 pages).

* cited by examiner

*Primary Examiner* — Suberr L Chi
(74) *Attorney, Agent, or Firm* — Lewis Roca Rothgerber Christie LLP

(57) ABSTRACT

A display device includes a plurality of subpixels arranged along a first direction and a second direction crossing the first direction, where each of the subpixels includes an emission area, a plurality of electrodes located in the emission area, extending in the first direction and spaced from one another in the second direction, and a plurality of light-emitting elements located on electrodes spaced from one another in the second direction, and where the subpixels include a plurality of first-type subpixels and a plurality of second-type subpixels, the second-type subpixels having a different number of electrodes in the emission area from the first-type subpixels.

20 Claims, 25 Drawing Sheets

DISPLAY DEVICE

CROSS-REFERENCE TO RELATED APPLICATION

This application claims priority to and the benefit of Korean Patent Application No. 10-2020-0115273, filed on Sep. 9, 2020, in the Korean Intellectual Property Office, the content of which in its entirety is herein incorporated by reference.

BACKGROUND

1. Field

The present disclosure relates to a display device.

2. Description of the Related Art

Display devices are becoming more important with developments in multimedia technology. Accordingly, various display devices such as a liquid crystal display (LCD) device, an organic light-emitting diode (OLED) display device, and the like have been used.

A typical display device includes a display panel for displaying an image, such as an OLED display panel or an LCD panel. A light-emitting display panel, which is a type of display panel, may include light-emitting elements such as, for example, light-emitting diodes (LEDs). The LEDs may be classified into OLEDs using an organic material as a light-emitting material and inorganic LEDs (ILEDs) using an inorganic material as a light-emitting material.

SUMMARY

Embodiments of the present disclosure provide a display device in which pixels having different electrode configurations are arranged.

Embodiments of the present disclosure also provide a display device having uniform luminance regardless of the locations of pixels having different configurations.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, a display device includes a plurality of subpixels arranged along a first direction and a second direction crossing the first direction, where each of the subpixels includes an emission area, a plurality of electrodes located in the emission area, extending in the first direction and spaced from one another in the second direction, and a plurality of light-emitting elements located on the electrodes spaced from one another in the second direction, and wherein the subpixels include a plurality of first-type subpixels and a plurality of second-type subpixels, the second-type subpixels having a different number of electrodes in the emission areas from the first-type subpixels.

The first-type subpixels may include more light-emitting elements per unit area of the emission area and fewer electrodes in the emission area than the second-type subpixels.

The display device may further include a plurality of first areas, in which the first-type subpixels are arranged along the first and second directions, and a plurality of second areas adjacent to the first areas, the second-type subpixels being arranged along the first and second directions in the second areas, wherein the first areas and the second areas have a same length in the first direction.

The first areas and the second areas may be alternately arranged along the second direction, and a distance, in the second direction, between the second areas may be uniform.

At least some of the second areas may have a smaller width than other ones of the second areas in the second direction.

Each of the subpixels may further include a subarea spaced from the emission area in the first direction, and the electrodes of each of the subpixels arranged along the first direction may be separately located in the subarea of a corresponding one of the subpixels.

The display device may further include a plurality of first pixels, each of the plurality of first pixels including two or more of the first-type subpixels, and a plurality of second pixels, each of the plurality of second pixels including two or more of the second-type subpixels, wherein the first pixels may be arranged along the first direction, and the second pixels may be arranged along the first direction.

Each of the first-type subpixels may include a first electrode, a second electrode spaced from the first electrode in the second direction, and first light-emitting elements located on the first and second electrodes, and each of the second-type subpixels may include a third electrode spaced from the first electrode in the first direction, a fourth electrode spaced from the second electrode in the first direction, and second light-emitting elements located on the third and fourth electrodes.

Each of the first-type subpixels may further include a first contact electrode on the first electrode and a second contact electrode on the second electrode, the first contact electrode may be in contact with first end portions of the first light-emitting elements, and the second contact electrode may be in contact with second end portions of the first light-emitting elements.

Each of the second-type subpixels may further include a first contact electrode on the first electrode, a second contact electrode on the fourth electrode, and a third contact electrode on the third electrode and the first contact electrode may be in contact with first end portions of the first light-emitting elements, the third contact electrode may be in contact with second end portions of the first light-emitting elements and first end portions of the second light-emitting elements, and the second contact electrode may be in contact with second end portions of the second light-emitting elements.

Each of the subpixels may include a first electrode, a second electrode spaced from the first electrode in the second direction, a third electrode spaced from the first electrode in the first direction, and a fourth electrode spaced from the second electrode in the first direction, and each of the second-type subpixels may further include a fifth electrode between the first electrode and the second electrode, a sixth electrode spaced from the second electrode in the second direction, a seventh electrode spaced from the fifth electrode in the first direction, and an eighth electrode spaced from the sixth electrode in the first direction.

Each of the first-type subpixels may further include first light-emitting elements located on the first electrode and the second electrode, second light-emitting elements located on the third electrode and the fourth electrode, and a first contact electrode and a second contact electrode located on the first electrode and the second electrode, respectively.

Each of the second-type subpixels may further include first light-emitting elements located on the first electrode and the fifth electrode, second light-emitting elements located on the second electrode and the sixth electrode, third light-emitting elements located on the third electrode and the seventh electrode, fourth light-emitting elements located on the fourth electrode and the eighth electrode, a first contact electrode on the first electrode and a second contact electrode on the second electrode, a third contact electrode on the third electrode and the fifth electrode, a fourth contact electrode on the seventh electrode and the eighth electrode, and a fifth contact electrode on the fourth electrode and the sixth electrode.

The subpixels may further include third-type subpixels, and each of the third-type subpixels may include a ninth electrode between the first electrode and the third electrode, and a tenth electrode spaced from the ninth electrode in the second direction and located between the second electrode and the fourth electrode.

According to an embodiment of the present disclosure, a display device includes a display area in which a plurality of pixels including a plurality of subpixels is located; and a non-display area surrounding the display area, wherein each of the subpixels includes a first electrode group including a plurality of electrodes extending in a first direction and spaced from one another in a second direction crossing the first direction, a second electrode group spaced from the first electrode group in the first direction and including a plurality of electrodes spaced from one another in the second direction, and a plurality of light-emitting elements located on the electrodes and spaced from one another in the first direction, wherein the pixels include a plurality of first pixels and a plurality of second pixels having a different number of electrodes located in each of the subpixels from the first pixels, and where the display area includes a plurality of first areas in which the first pixels are located, and a plurality of second areas in which the second pixels are located.

Each of the subpixels may further includes an emission area in which the light-emitting elements and the electrodes are located, the first pixels may have more light-emitting elements per unit area of the emission area and fewer electrodes in the emission area than the second pixels.

The first areas and the second areas may extend in the first direction and be alternately arranged in the second direction, and the first areas and the second areas may have a same length in the first direction.

The first areas may be located between second areas spaced from each other in the second direction, and a distance, in the second direction, between the second areas may be uniform.

A width of first ones of the second areas in outermost parts, in the second direction, of the display area may be smaller than a width of second ones of the second areas in middle of the display area.

The display area may further include third areas between the first areas and the second areas and in which third pixels having a different number of electrodes in each of the subpixels from the first pixels and the second pixels are located.

According to the aforementioned and other embodiments of the present disclosure, a display device including different types of groups of subpixels having different electrode configurations and different number of serial connects between light-emitting elements is provided. The display device can have a subpixel arrangement corresponding to the distribution of printing processes and can prevent some areas thereof from having low luminance, even though the subpixels have different numbers of light-emitting elements per unit area of the emission area.

In some embodiments, the display device can correct driving signals for the different types of groups of subpixels and can thereby have uniform luminance at any location in its display area, even though the subpixels have different numbers of light-emitting elements disposed per unit area of the emission area and have different numbers of serial connections between light-emitting elements.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Figure 1:
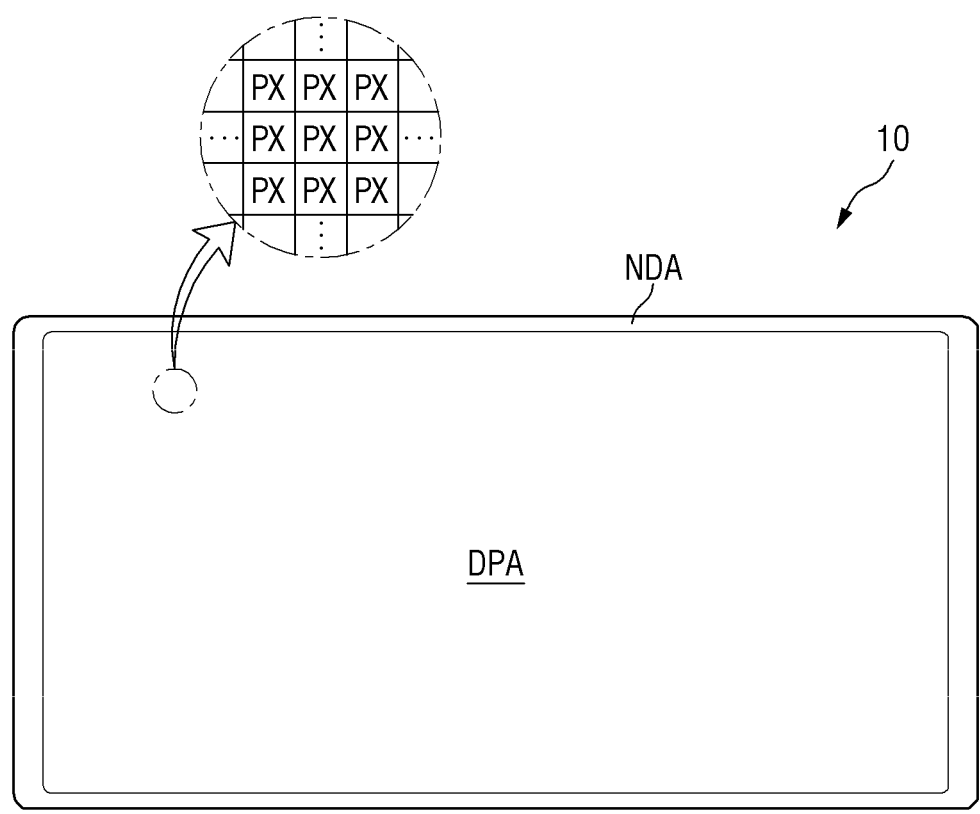
FIG. 1 is a plan view of a display device according to an embodiment of the present disclosure.

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that when an element or layer is referred to as being "connected to", "coupled to", or "adjacent to" another element or layer, it may be directly connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

Hereinafter, embodiments will be described with reference to the attached drawings.

FIG. 1 is a plan view of a display device according to an embodiment of the present disclosure.

Referring to FIG. 1, a display device 10 displays a moving or still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 includes a display panel that provides a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but the present disclosure is not limited thereto. That is, various other display panels are also applicable to the display panel of the display device 10.

The shape of the display device 10 may vary. For example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA both have a rectangular shape that extends in a first direction DR1.

The display device 10 may include the display area DPA and a non-display area NDA (e.g., the non-display area NDA may surround the display area DPA along the edge or periphery of the display area DPA). The display area DPA may be an area in which a screen is displayed, and the non-display area NDA may be an area in which a screen is not displayed. The display area DPA may also be referred to as an active area, and the non-display area NDA may also be referred to as an inactive area. The display area DPA may occupy the middle part (e.g., a central region) of the display device 10.

The display area DPA may include a plurality of pixels PX. The pixels PX may be arranged in row and column directions. The pixels PX may have a rectangular or square shape in a plan view, but the present disclosure is not limited thereto. Alternatively, the pixels PX may have a rhombus shape having sides that are inclined with respect to a particular direction. The pixels PX may be alternately arranged in a stripe arrangement or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. Each of the pixels PX may include one or more light-emitting elements, which emit light of a particular wavelength range.

The non-display area NDA may be disposed around the display area DPA. The non-display area NDA may surround the entire display area DPA or part of the display area DPA along the edge or periphery of the display area DPA. The display area DPA may have a rectangular shape, and the non-display area NDA may be disposed adjacent to four sides of the display area DPA. The non-display area NDA may form the bezel of the display device 10. Wires or circuit drivers included in the display device 10 may be disposed in the non-display area NDA, or external devices may be mounted in the non-display area NDA.

Figure 2:
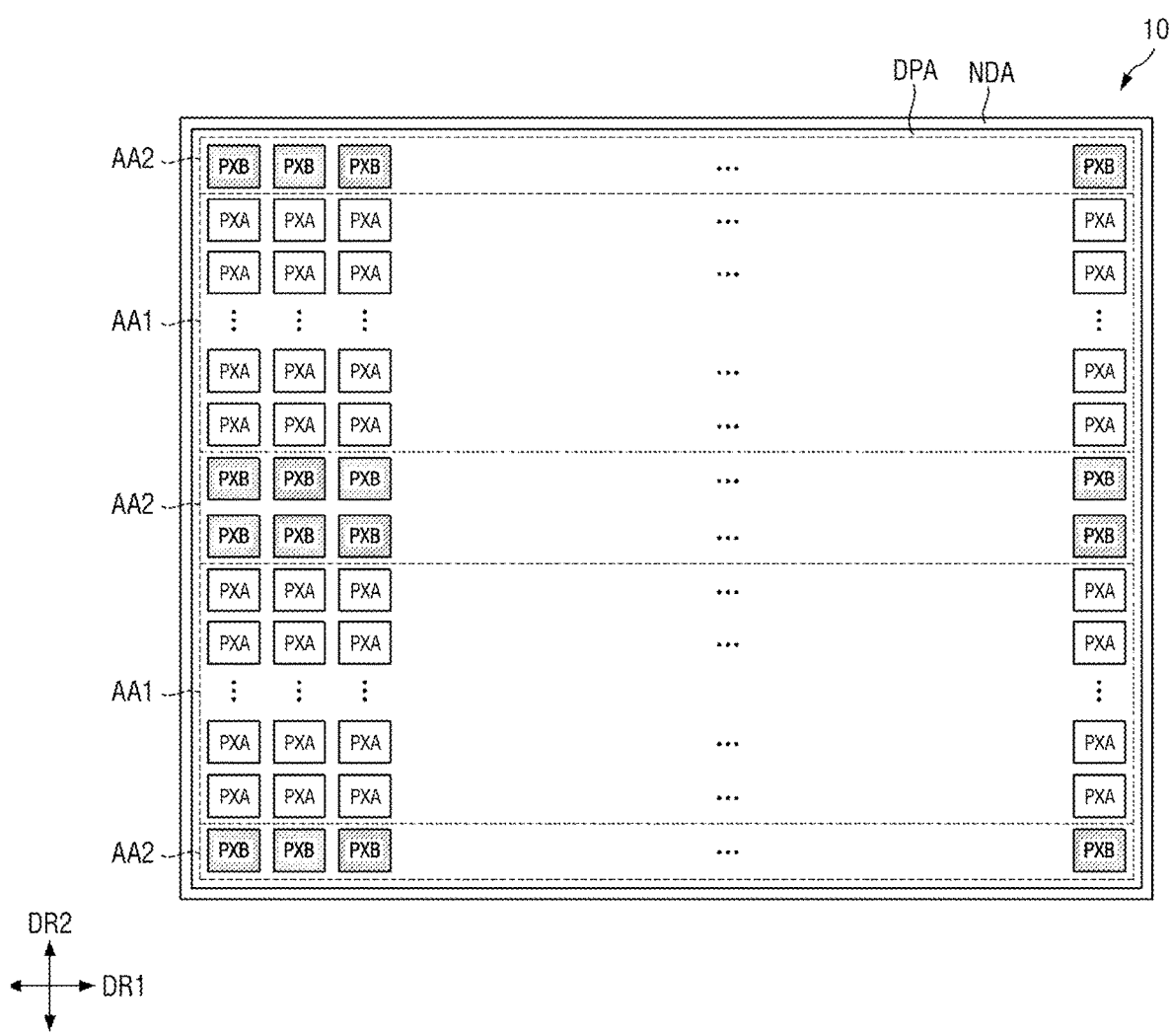
FIG. 2 is a layout view illustrating the arrangement of a plurality of pixels in the display device of FIG. 1.

FIG. 2 is a layout view illustrating the arrangement of a plurality of pixels in the display device of FIG. 1.

Referring to FIG. 2, the display device 10 may include a plurality of first pixels PXA and a plurality of second pixels PXB. The display area DPA of the display device 10 may include first areas AA1, in which the first pixels PXA are arranged, and second areas AA2, in which the second pixels PXB are arranged.

In a case where the display device 10 extends longer in the first direction DR1 than in a second direction DR2, the first pixels PXA and the second pixels PXB may be arranged along the first direction DR1. In the display area DPA, a plurality of pixels PX may be arranged in multiple pixel rows, and pixels arranged in each of the pixel rows along the first direction DR1 may all be the same. For example, in each of the pixel rows, a plurality of first pixels PXA or a plurality of second pixels PXB may be arranged, and the type of pixels PX may be the same or different between each pair of adjacent pixel rows. The first pixels PXA may be arranged in multiple pixel rows, the second pixels PXB may also be arranged in multiple pixel rows, and a plurality of pixel rows may be arranged in each of the first areas AA1 and of the second areas AA2. In each of the first areas AA1 and of the second areas AA2, a plurality of pixels PX of the same type may be arranged along the first and second directions DR1 and DR2, and different types of groups of pixels PX may be arranged in two adjacent pixel rows on both sides, in the second direction DR2, of each of the boundaries between the first areas AA1 and the second areas AA2.

As will be described later, the display device 10 may include different types of groups of subpixels PXn, which differ from one another in the configuration of electrodes thereof and the pattern of connection of light-emitting elements therein, and the different types of groups of subpixels PXn may be arranged in the first areas AA1 and the second areas AA2. The different types of groups of subpixels PXn may form the first pixels PXA and the second pixels PXB, and the first pixels PXA and the second pixels PXB may be arranged in separate areas. During the fabrication of the display device 10, inkjet printing may be performed, and the number of light-emitting elements printed in each area or each subpixel PXn may vary depending on the distribution of printing process. To compensate for differences in luminance caused by differences in the number of light-emitting elements, the display device 10 may include groups of subpixels PXn having different electrode configurations in accordance with the distribution of printing processes, and this will be described later in detail.

FIG. 2 illustrates that as different types of groups of subpixels PXn form the first pixels PXA and the second pixels PXB, the first areas AA1 and the second areas AA2 are distinguished from one another depending on the arrangement of the first pixels PXA and the second pixels PXB, but the present disclosure is not limited thereto. Alternatively, as different types of groups of subpixels PXn having different electrode configurations are arranged in the display area DPA, the first areas AA1 and the second areas AA2 may be distinguished from one another depending on the arrangement of the different types of groups of subpixels PXn, in which case, each of the pixels PX may be formed by different types of subpixels PXn. The structures of the pixels PX and subpixels PXn included in each of the pixels PX will hereinafter be described.

Figure 3:
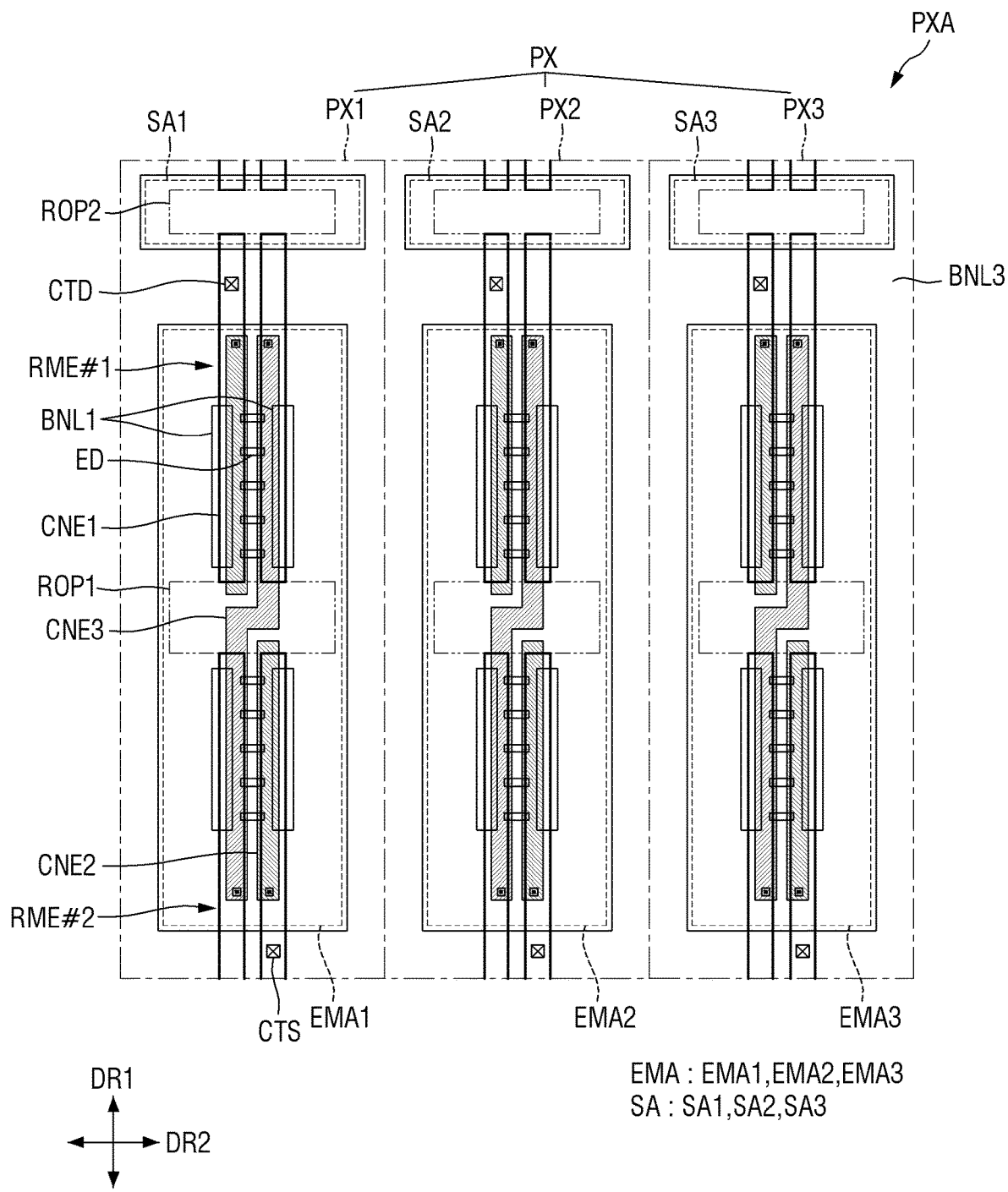
FIG. 3 is a plan view of a first pixel of the display device of FIG. 1.
Figure 4:
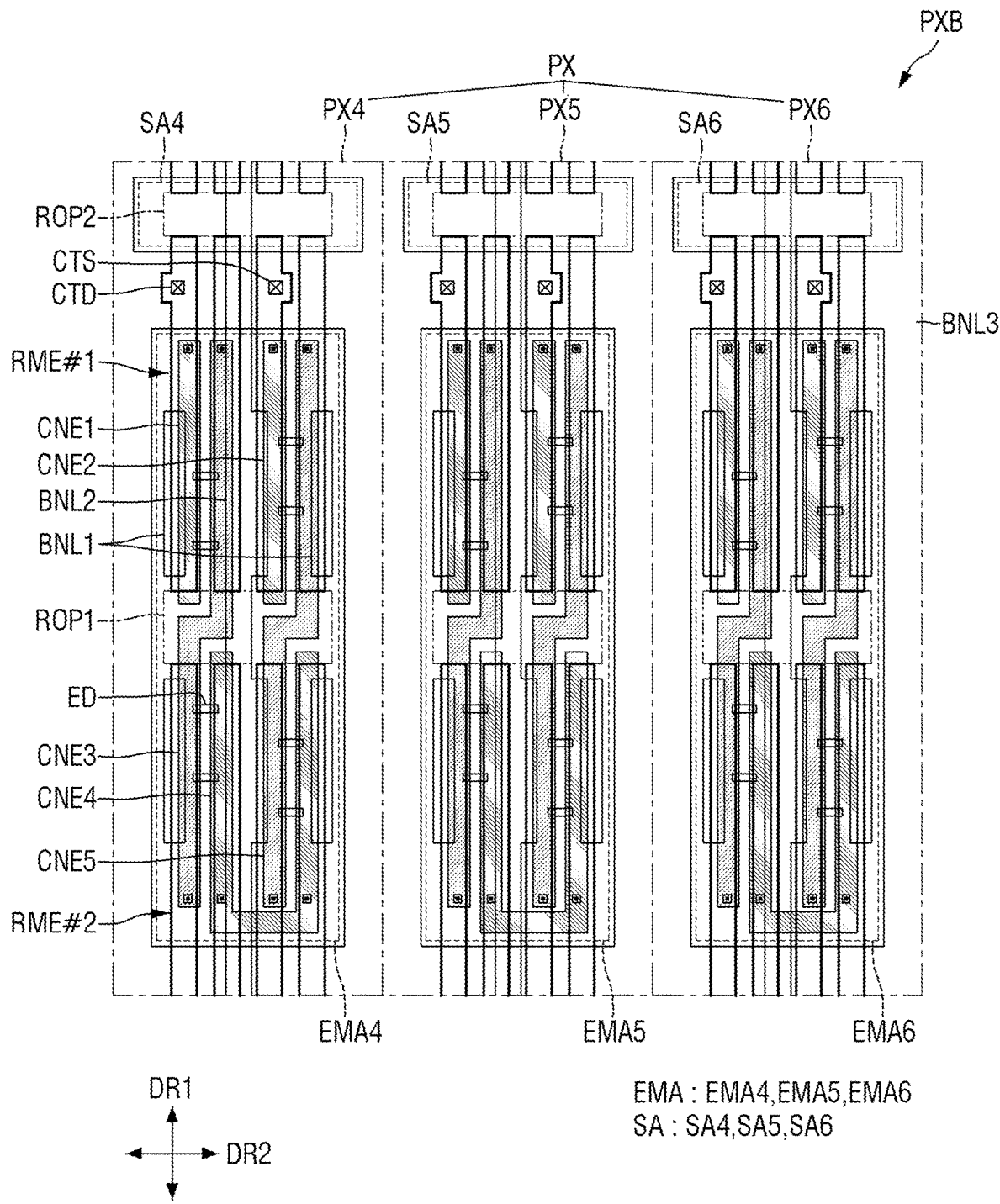
FIG. 4 is a plan view of a second pixel of the display device of FIG. 1.

FIG. 3 is a plan view of a first pixel of the display device of FIG. 1. FIG. 4 is a plan view of a second pixel of the display device of FIG. 1.

Referring to FIGS. 3 and 4 and further to FIG. 2, a pixel PX may include a plurality of subpixels PXn (where n is an integer of 1 to 6). For example, a first pixel PXA arranged in a first area AA1 may include first, second, and third subpixels PX1, PX2, and PX3, and a second pixel PXB arranged in a second area AA2 may include fourth, fifth, and sixth subpixels PX4, PX5, and PX6. The first and fourth subpixels PX1 and PX4 may emit first-color light, the second and fifth subpixels PX2 and PX5 may emit second-color light, and the third and sixth subpixels PX3 and PX6 may emit third-color light. For example, the first-color light, the second-color light, and the third-color light may be blue light, green light, and red light, respectively, but the present disclosure is not limited thereto. Alternatively, the subpixels PXn may all emit light of the same color. FIGS. 3 and 4 illustrate that the pixel PX may include three subpixels PXn, but the present disclosure is not limited thereto. Alternatively, the pixel PX (e.g., a first pixel PXA or a second pixel PXB) may include more than three subpixels PXn.

The subpixels PXn may be arranged along the second direction DR2. In a case where the display device 10 extends longer in the first direction DR1 than in the second direction DR2, the subpixels PXn may be arranged in the second direction DR2, and subpixels PXn of the same type may be arranged along the first direction DR1. However, the present disclosure is not limited to this.

Each of the subpixels PXn may include an emission area EMA and a non-emission area. The emission area EMA may be an area that outputs light of a particular wavelength range due to light-emitting elements ED being disposed therein, and the non-emission area may be an area in which no light-emitting elements ED are disposed and therefore does not output light due to not being reached by light emitted by light-emitting elements ED. The emission area EMA may include a region in which light-emitting elements ED are disposed and regions around the light-emitting elements ED that output light emitted by the light-emitting elements ED.

However, the present disclosure is not limited to this. The emission area EMA may also include regions that output light emitted by the light-emitting elements ED and then reflected or refracted by other members. A plurality of light-emitting elements ED may be disposed in each of the subpixels PXn to form an emission area EMA including a region in which the plurality of light-emitting elements ED are disposed and the surroundings of the region in which the plurality of light-emitting elements ED are disposed.

FIGS. 3 and 4 illustrate that first, second, and third emission areas EMA1, EMA2, and EMA3 of the first, second, and third subpixels PX1, PX2, and PX3 have substantially the same size, and that fourth, fifth, and sixth emission areas EMA4, EMA5, and EMA6 of the fourth, fifth, and sixth subpixels PX4, PX5, and PX6 have substantially the same size, but the present disclosure is not limited thereto. In some embodiments, the emission areas EMA of the subpixels PXn may have different sizes depending on the color or the wavelength of light emitted by light-emitting elements ED.

Each of the subpixels PXn may further include a subarea SA, which is disposed in the non-emission area of the display device 10. The subareas SA of the subpixels PXn may be disposed on first sides, in the first direction DR1, of the emission areas EMA of the subpixels PXn, between emission areas EMA of pairs of adjacent subpixels PXn in the first direction DR1. For example, a plurality of emission areas EMA may be arranged one after another along the second direction DR2, a plurality of subareas SA may be arranged one after another along the second direction DR2, and the plurality of emission areas EMA and the plurality of subareas SA may be alternately arranged along the first direction DR1. A third bank BNL3 may be disposed between adjacent ones of the subareas SA and the emission areas EMA of the subpixels PXn, and the distance between the subareas SA and the emission areas EMA of the subpixels PXn may vary depending on the width of the third bank BNL3. Parts of electrodes RME may be disposed in the subareas SA of the subpixels PXn that do not output light due to no light-emitting elements ED being disposed therein. The electrodes RME may be divided in the subareas SA of the subpixels PXn.

In a plan view, the third bank BNL3 may include parts that extend in the first direction DR1 and parts that extend in the second direction DR2 and may be arranged in a lattice pattern over the entire surface of the display area DPA. The third bank BNL3 may be disposed along the boundaries between the subpixels PXn to define the subpixels PXn. The third bank BNL3 may be disposed to surround, and thereby define, the emission areas EMA and the subareas SA of the subpixels PXn.

Figure 5:
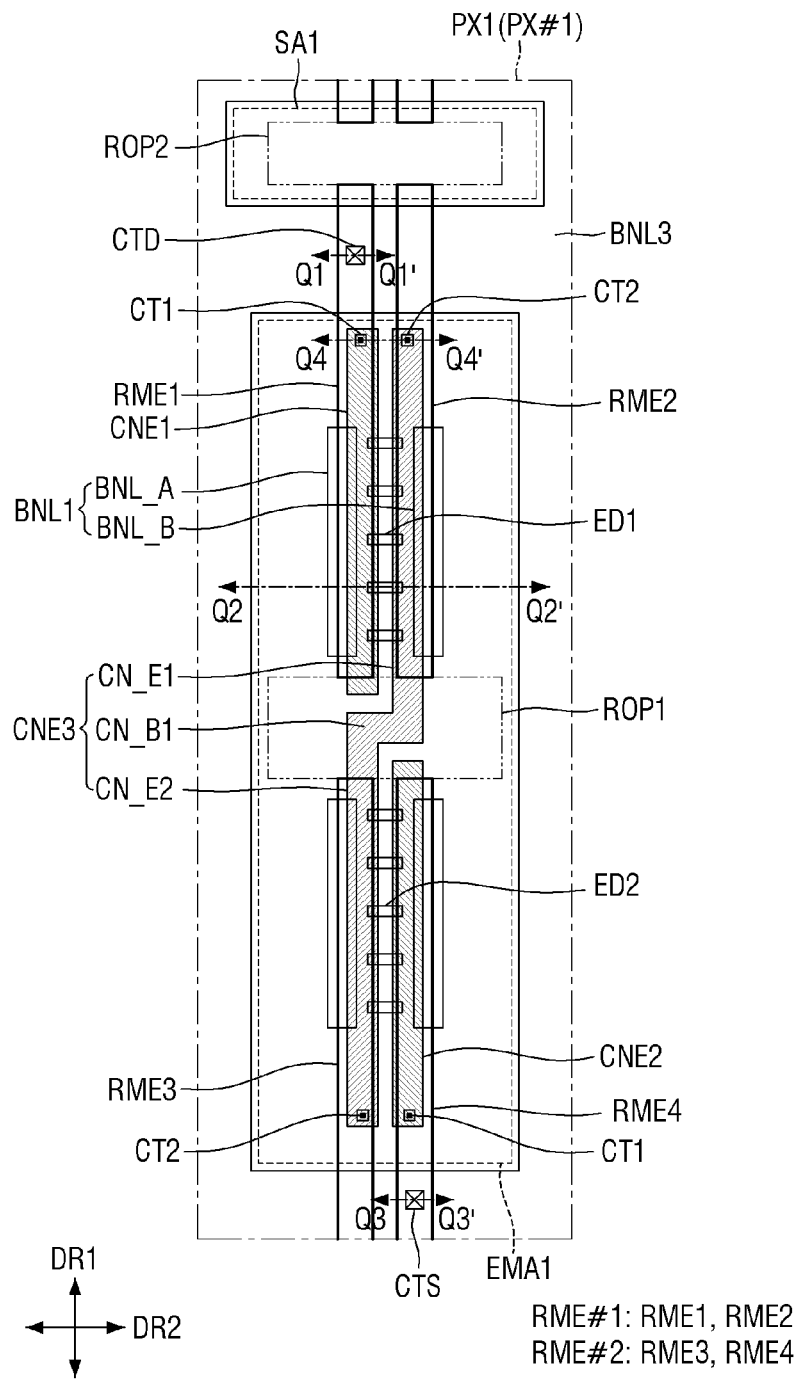
FIG. 5 is a plan view of a first-type subpixel of FIG. 3.
Figure 6:
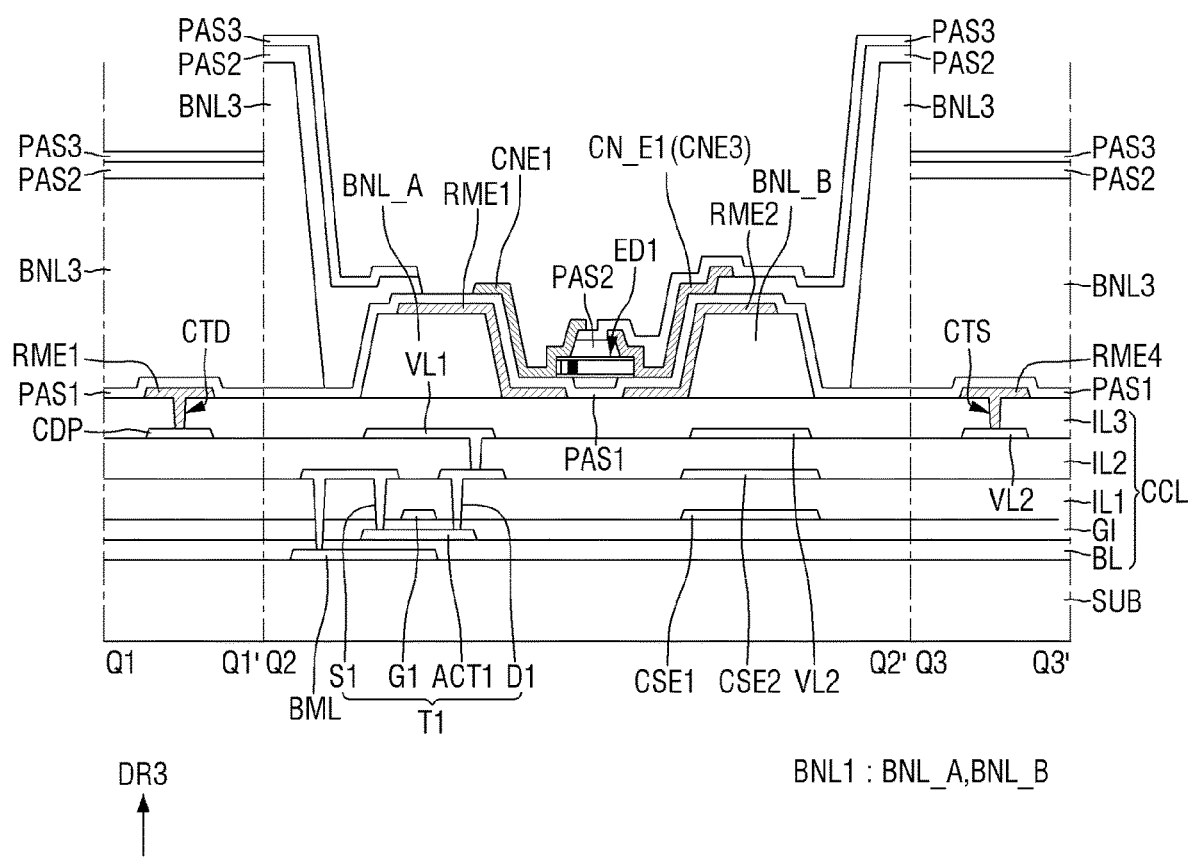
FIG. 6 is a cross-sectional view taken along the lines Q1-Q1', Q2-Q2', and Q3-Q3' of FIG. 5.
Figure 7:
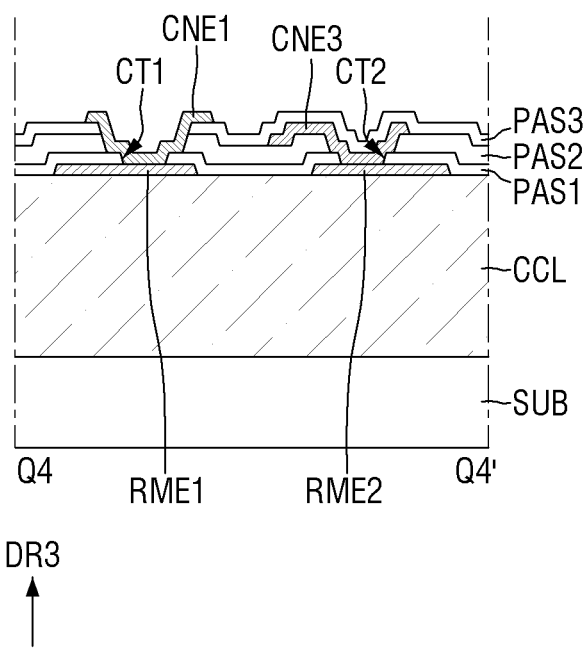
FIG. 7 is a cross-sectional view taken along the line Q4-Q4' of FIG. 5.
Figure 8:
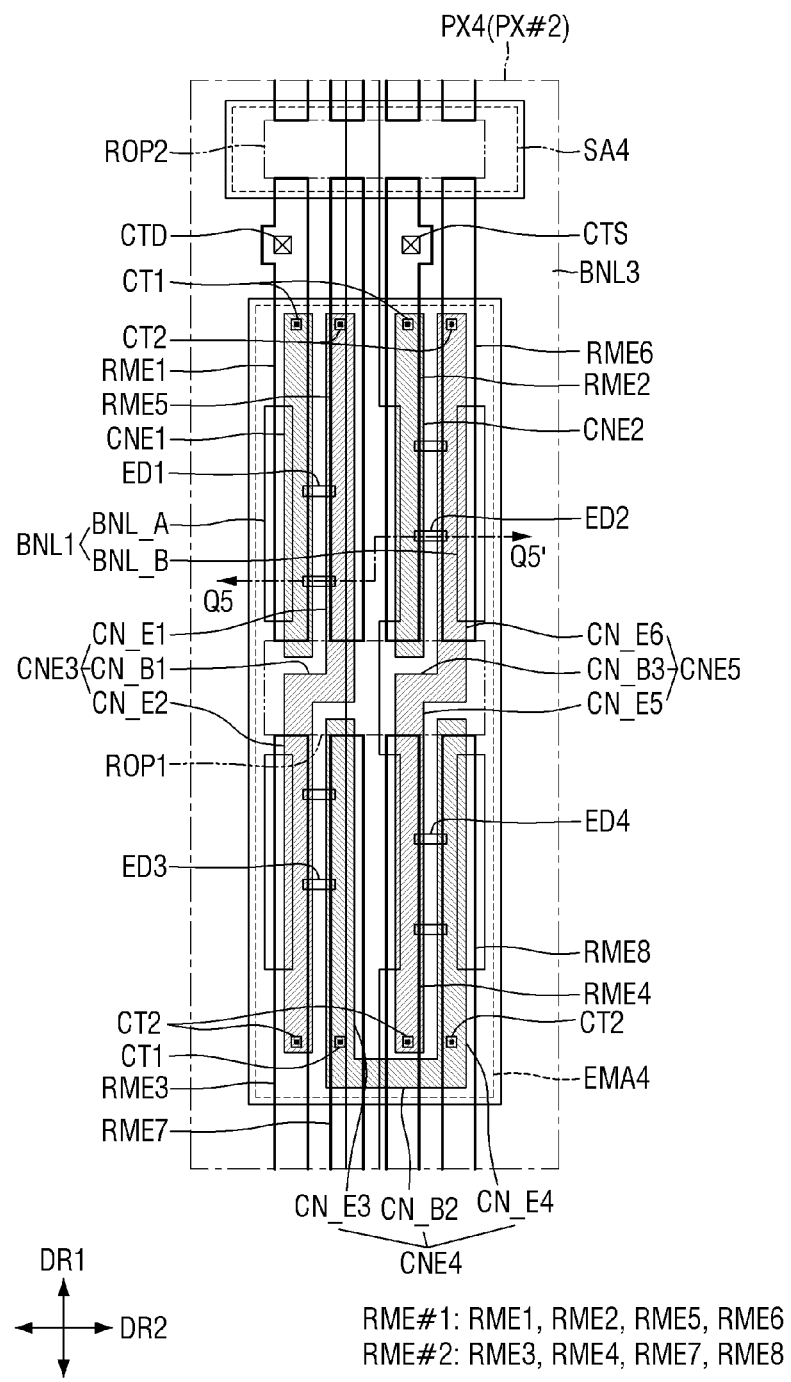
FIG. 8 is a plan view of a second-type subpixel of FIG. 4.
Figure 9:
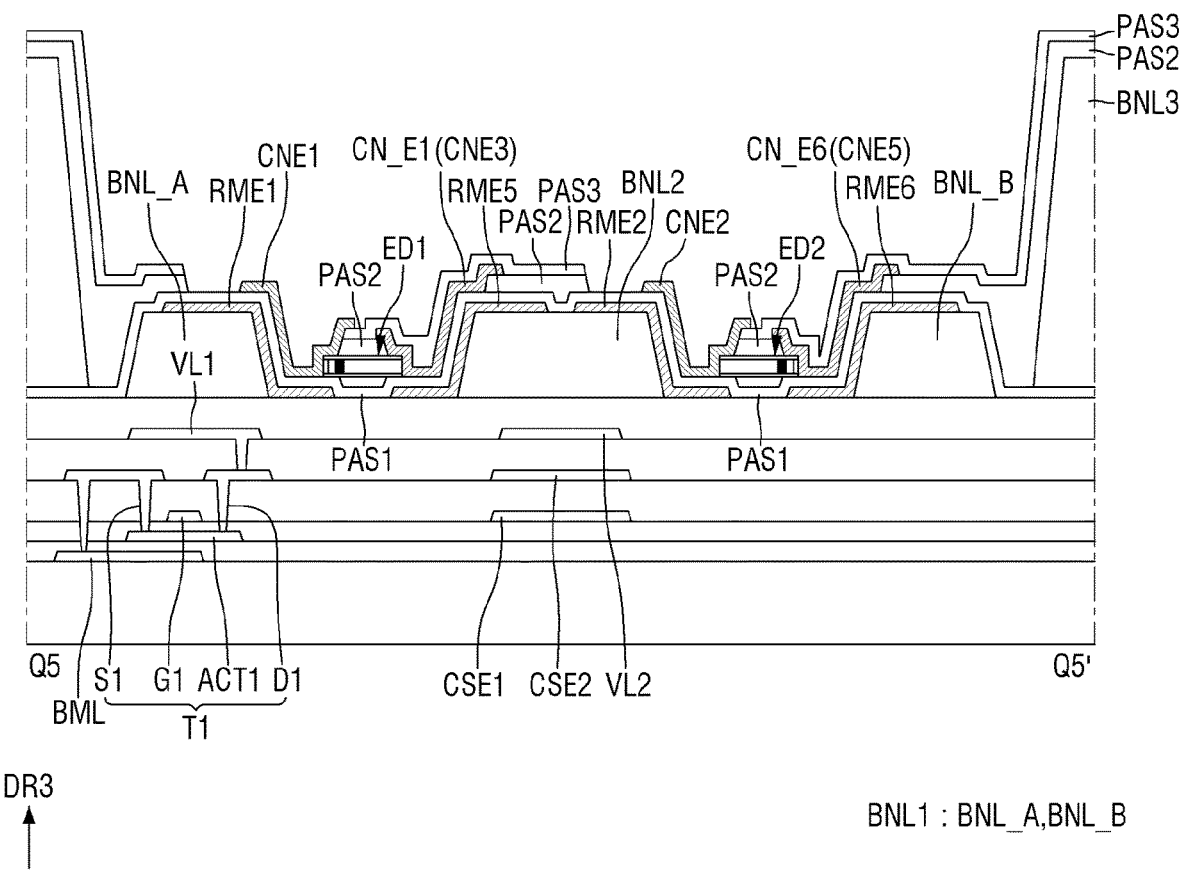
FIG. 9 is a cross-sectional view taken along the line Q5-Q5' of FIG. 8.

FIG. 5 is a plan view of a first-type subpixel of FIG. 3. FIG. 6 is a cross-sectional view taken along the lines Q1-Q1', Q2-Q2', and Q3-Q3' of FIG. 5. FIG. 7 is a cross-sectional view taken along the line Q4-Q4' of FIG. 5. FIG. 8 is a plan view of a second-type subpixel of FIG. 4. FIG. 9 is a cross-sectional view taken along the line Q5-Q5' of FIG. 8. FIG. 5 illustrates a first subpixel PX1 of a first pixel PXA as a first-type subpixel PX #1, and FIG. 8 illustrates a fourth subpixel PX4 of a second pixel PXB as a second-type subpixel PX #2. FIGS. 6 and 9 illustrate cross-sectional views taken from one end portion to another end portion of a light-emitting element ED disposed in one subpixel PXn. FIG. 7 illustrates a cross-sectional view taken across contacts (CT1 and CT2) that electrodes RME and contact electrodes CNE are in contact with.

The structure of a first-type subpixel PX #1 of a first pixel PXA will hereinafter be described with reference to FIGS. 5-7 and further to FIG. 3. The display device 10 may include the first substrate SUB, and a semiconductor layer, a plurality of conductive layers, and a plurality of insulating layers that are disposed on the first substrate SUB. The semiconductor layer, the conductive layers, and the insulating layers may form a circuit layer CCL and a display element layer of the display device 10.

The first substrate SUB may be an insulating substrate. The first substrate SUB may be formed of an insulating material such as glass, quartz, or a polymer resin. The first substrate SUB may be a rigid substrate or may be a flexible substrate that is bendable, foldable, or rollable.

A first conductive layer may be disposed on the first substrate SUB. The first conductive layer includes a lower metal layer BML, and the lower metal layer BML is disposed to overlap with an active layer ACT1 of a first transistor T1. The lower metal layer BML may include a material capable of blocking the transmission of light and may prevent light from being incident upon the active layer ACT1 of the first transistor T1. In some embodiments, the lower metal layer BML may not be provided.

A buffer layer BL may be disposed on the lower metal layer BML and on the entire surface of the first substrate SUB. The buffer layer BL may be formed on the first substrate SUB to protect the transistors of the first subpixel PX1 from moisture that may penetrate through the first substrate SUB, which is vulnerable to moisture, and may perform a surface planarization function.

The semiconductor layer is disposed on the buffer layer BL. The semiconductor layer may include the active layer ACT1 of the first transistor T1. The active layer ACT1 may be disposed to partially overlap in a thickness direction of the substrate SUB (e.g., DR3 in FIG. 6) with a gate electrode G1 in a second conductive layer that will be described later.

The semiconductor layer may include polycrystalline silicon, monocrystalline silicon, or an oxide semiconductor. In a case where the semiconductor layer includes an oxide semiconductor, the active layer ACT1 may include a plurality of conductor regions and a channel region between the conductor regions. The oxide semiconductor may be an oxide semiconductor containing indium (In). For example, the oxide semiconductor may be at least one of indium tin oxide (ITO), indium zinc oxide (IZO), indium gallium oxide (IGO), indium zin tin oxide (IZTO), indium gallium tin oxide (IGTO), or indium gallium zinc tin oxide (IGZTO).

Alternatively, the semiconductor layer may include polycrystalline silicon, which may be formed by crystallizing amorphous silicon. In this case, the conductor regions of the active layer ACT1 may be regions doped with impurities, but the present disclosure is not limited thereto.

FIG. 6 illustrates only the first transistor T1, but the present disclosure is not limited thereto. That is, the first subpixel PX1 may include other transistors than the first transistor T1. For example, the display device 10 may include, in the first subpixel PX1, two or three transistors including the first transistor T1.

A first gate insulating layer GI is disposed on the semiconductor layer and the buffer layer BL. The first gate insulating layer GI may function as a gate insulating film for the transistors of the first subpixel PX1.

A second conductive layer is disposed on the first gate insulating layer GI. The second conductive layer may include a gate electrode G1 of the first transistor T1 and a first capacitive electrode CSE1 of a storage capacitor. The gate electrode G1 may be disposed to overlap with the channel region of the active layer ACT1 in the thickness direction. The first capacitive electrode CSE1 may be disposed to overlap, in the thickness direction, with a second capacitive electrode CSE2 that will be described later. In some embodiments, the first capacitive electrode CSE1 may be integrally formed with, and connected to, the gate electrode G1.

A first interlayer insulating layer IL1 is disposed on the second conductive layer. The first interlayer insulating layer IL1 may function as an insulating film between the second conductive layer and layers disposed on the second conductive layer. The first interlayer insulating layer IL1 may be disposed to cover and protect the second conductive layer.

A third conductive layer is disposed on the first interlayer insulating layer IL1. The third conductive layer may include a first source electrode S1 and a first drain electrode D1 of the first transistor T1 and the second capacitive electrode CSE2.

The first source electrode S1 and the first drain electrode D1 of the first transistor T1 may be in contact with the doping regions of the active layer ACT1 through contact holes that penetrate the first interlayer insulating layer IL1 and the first gate insulating layer GI. The first source electrode S1 of the first transistor T1 may be in contact with the lower metal layer BML through another contact hole penetrating through the first interlayer insulating layer IL1, the first gate insulating layer GI, and the buffer layer BL.

The second capacitive electrode CSE2 is disposed to overlap with the first capacitive electrode CSE1 in the thickness direction. For example, the second capacitive electrode CSE2 may be integrally formed with, and connected to, the first source electrode S1. A storage capacitor may be formed between the first and second capacitive electrodes CSE1 and CSE2.

Although not specifically illustrated, the third conductive layer may further include a data line that applies a data signal to other transistors than the first transistor T1. The data line may be connected to, and transmit signals to, the source/drain electrodes of the other transistors.

A second interlayer insulating layer IL2 is disposed on the third conductive layer. The second interlayer insulating layer IL2 may function as an insulating film between the third conductive layer and layers disposed on the third conductive layer. The second interlayer insulating layer IL2 may be disposed to cover and protect the third conductive layer.

A fourth conductive layer is disposed on the second interlayer insulating layer IL2. The fourth conductive layer may include a first voltage line VL1, a second voltage line VL2, and a first conductive pattern CDP. A high-potential voltage (or a first power supply voltage) to be provided to the first transistor T1 may be applied to the first voltage line VL1, and a low-potential voltage (or a second power supply voltage) to be provided to a second electrode RME2 or a fourth electrode RME4 may be applied to the second voltage line VL2.

The first conductive pattern CDP may be connected to the second capacitive electrode CSE2 and may thereby be electrically connected to the first transistor T1. The first conductive pattern CDP may be in contact with a first electrode RME1 that will be described later, and the first transistor T1 may transmit the first power supply voltage applied thereto from the first voltage line VL1 to the first electrode RME1. The fourth conductive layer is illustrated as including one first voltage line VL1 and one second voltage line VL2, but the present disclosure is not limited thereto. That is, the fourth conductive layer may include more than one first voltage line VL1 and more than one second voltage line VL2.

Each of the buffer layer BL, the first gate insulating layer GI, the first interlayer insulating layer IL1, and the second interlayer insulating layer IL2 may consist of a plurality of inorganic layers that are alternately stacked. For example, each of the buffer layer BL, the first gate insulating layer GI, the first interlayer insulating layer IL1, and the second interlayer insulating layer IL2 may be formed as a double or multilayer in which inorganic layers of at least one of silicon oxide ($SiO_x$), silicon nitride ($SiN_x$), and silicon oxynitride ($SiO_xN_y$) are alternately stacked, but the present disclosure is not limited thereto. In another example, each of the buffer layer BL, the first gate insulating layer GI, the first interlayer insulating layer IL1, and the second interlayer insulating layer IL2 may be formed as a single inorganic layer including silicon oxide ($SiO_x$), silicon nitride ($SiN_x$), or silicon oxynitride ($SiO_xN_y$).

The second, third, and fourth conductive layers may be formed as single layers or multilayers including molybdenum (Mo), aluminum (Al), chromium (Cr), gold (Au), titanium (Ti), nickel (Ni), neodymium (Nd), copper (Cu), or an alloy thereof, but the present disclosure is not limited thereto.

A third interlayer insulating layer IL3 is disposed on the fourth conductive layer. The third interlayer insulating layer IL3 may include an organic insulating material such as, for example, polyimide (PI), and may perform a surface planarization function.

A plurality of first banks BNL1, a plurality of electrodes RME, light-emitting elements ED, a plurality of contact electrodes CNE, and the third bank BNL3 are disposed on the third interlayer insulating layer IL3 as a display element layer. Also, a plurality of insulating layers (PAS1, PAS2, and PAS3) may be further disposed on the third interlayer insulating layer IL3.

The first banks BNL1 may be disposed in the first emission area EMA1 to be spaced from one another. For example, the first banks BNL1 may include a plurality of sub-banks (BNL_A and BNL_B), which are disposed in the first emission area EMA1 to be spaced from one another in the second direction DR2. First sub-banks BNL_A may be disposed on the left side of the center of the first emission area EMA1, and second sub-banks BNL_B may be disposed on the right side of the center of the first emission area EMA1. The sub-banks (BNL_A and BNL_B) may extend in the first direction DR1, and the length of the sub-banks (BNL_A and BNL_B) may be smaller than the length, in the first direction DR1, of an opening surrounded by the third bank BNL3. Two first sub-banks BNL_A and two second sub-banks BNL_B may be disposed in the first subpixel PX1 to be spaced from each other in the first direction DR1. The first banks BNL1 may form island patterns that extend in one direction, over the entire surface of the display area DPA.

At least parts of the first banks BNL1 may protrude from the top surface of the third interlayer insulating layer IL3.

Parts of the first banks BNL1 that protrude may each have inclined side surfaces, and light emitted by the light-emitting elements ED may be reflected by the electrodes RME, which are disposed on the first banks BNL1, to be emitted in an upward direction from the third interlayer insulating layer IL3. The side surfaces of each of the first banks BNL1 may be linearly inclined, but the present disclosure is not limited thereto. Alternatively, the outer surfaces of the first banks BNL1 may have a semicircular or semielliptical shape with curvature. The first banks BNL1 may include an organic insulating material such as polyimide, but the present disclosure is not limited thereto.

A plurality of electrodes RME may extend in one direction and may be disposed in each of the subpixels PXn. For example, a plurality of electrodes RME may extend in the first direction DR1 and may be disposed in the first subpixel PX1 to be spaced from one another in the first and second directions DR1 and DR2. For example, the electrodes RME may be divided into electrode groups (RME #1 and RME #2), each including electrodes RME that are arranged side-by-side along the second direction DR2 to be spaced from each other, and the electrode groups (RME #1 and RME #2) may be spaced from each other in the first direction DR1.

For example, the electrode groups (RME #1 and RME #2) may include first and second electrode groups RME #1 and RME #2, which are spaced from each other in the first direction DR1. The first electrode group RME #1 may be disposed on one side, in the first direction DR1, of the center of the first emission area EMA1, for example, on the upper side of the center of the first emission area EMA1, and the second electrode group RME #2 may be disposed on the other side, in the first direction DR1, of the center of the first emission area EMA1, for example, on the lower side of the center of the first emission area EMA1. The first and second electrode groups RME #1 and RME #2 may be spaced from each other by a first separation part ROP1, which is disposed in the first emission area EMA1.

The electrodes RME in the first electrode group RME #1 may be disposed in part in a first subarea SA1 of the first subpixel PX1, beyond the third bank BNL3, and the electrodes RME in the second electrode group RME #2 may be disposed in the subarea SA of a neighboring subpixel PXn of the first subpixel PX1, beyond the third bank BNL3. That is, first and second electrode groups RME #1 and RME #2 from different subpixels PXn may be disposed in one subarea SA. First and second electrode groups RME #1 and RME #2 from different subpixels PXn may be spaced from each other by a second separation part ROP2 disposed in one subarea SA.

The electrodes RME from different electrode groups (RME #1 and RME #2) may be spaced from one another in the first direction DR1. For example, the electrodes in the first electrode group RME #1 may be arranged in the first direction DR1 with the electrodes in the second electrode group RME #2. For example, the electrodes in the first electrode group RME #1 may be arranged side-by-side in the first direction DR1. The electrodes in the second electrode group RME #2 may also be arranged side by side in the first direction DR1. The electrodes RME may be obtained by forming single electrode lines that extend in the first direction DR1 and then dividing each of the electrode lines. The electrode lines may be used to form an electric field in the first subpixel PX1 to align the light-emitting elements ED during the fabrication of the display device 10. The light-emitting elements ED may be aligned on the electrodes RME by a dielectrophoretic force from the electric field generated between two adjacent electrode lines. Once the light-emitting elements ED are aligned, the electrode lines may be divided in the first and second separation parts ROP1 and ROP2, thereby forming the electrode groups (RME #1 and RME #2), which are spaced from each other in the first direction DR1.

FIG. 5 illustrates that the first and second electrode groups RME #1 and RME #2 are separated from each other in the first separation part ROP1 in the first emission area EMA1, but the present disclosure is not limited thereto. Alternatively, in some embodiments, the electrodes RME may not be divided into different electrode groups (RME #1 and RME #2), in the first separation part ROP1, but may be connected throughout the first subpixel PX1. The number of electrodes RME included in each of the electrode groups (RME #1 and RME #2) may vary depending on the number of light-emitting elements ED disposed in the first subpixel PX1.

The first electrode group RME #1 may include the first and second electrodes RME1 and RME2, and the second electrode group RME #2 may include third and fourth electrodes RME3 and RME4. The electrodes RME may be disposed on a plurality of first banks BNL1 that are spaced from one another.

The first electrode RME1 may be disposed on the upper left side of the center of the first emission area EMA1. The first electrode RME1 may be disposed in part on the first sub-bank BNL_A disposed on the upper side of the center of the first emission area EMA1. The second electrode RME2 may be spaced from the first electrode RME1 in the second direction DR2 and may be disposed on the upper right side of the center of the first emission area EMA1. The second electrode RME2 may be disposed in part on the second sub-bank BNL_B disposed on the upper side of the center of the first emission area EMA1.

The third electrode RME3 may be disposed on the lower left side of the center of the first emission area EMA1 and may be spaced from the first electrode RME1 in the first direction DR1. The third electrode RME3 may be disposed in part on the first sub-bank BNL_A disposed on the lower side of the center of the first emission area EMA1. The fourth electrode RME4 may be disposed on the lower right side of the center of the first emission area EMA1 and may be spaced from the second electrode RME2 in the first direction DR1. The fourth electrode RME4 may be disposed in part on the second sub-bank BNL_B disposed on the lower side of the center of the first emission area EMA.

For example, the first and fourth electrodes RME1 and RME4 may be first-type electrodes connected to the fourth conductive layer disposed therebelow. For example, the first electrode RME1 may be formed in an area that overlaps with the third bank BNL3 and may be directly connected to the first conductive pattern CDP of the fourth conductive layer through a first electrode contact hole CTD that penetrates the third interlayer insulating layer IL3. For example, the fourth electrode RME4 may be formed in the area that overlaps with the third bank BNL3 and may be directly connected to the second voltage line VL2 of the fourth conductive layer through a second electrode contact hole CTS that penetrates the third interlayer insulating layer IL3.

The first electrode RME1 may be electrically connected to the first transistor T1 via the first conductive pattern CDP and may thus receive the first power supply voltage, and the second electrode RME2 may be electrically connected to the second voltage line VL2 and may thus receive the second power supply voltage. The second and third electrodes RME2 and RME3 may receive the first and second power supply voltages via the contact electrodes CNE that will be described later. Because the electrodes RME are disposed to be divided in each of the subpixels PXn, light-emitting elements ED of one subpixel PXn can emit light independently of light-emitting elements ED of another subpixel PXn. The first and second electrode contact holes CTD and CTS are illustrated as being formed at locations that overlap with the third bank BNL3, but the present disclosure is not limited thereto. Alternatively, the first and second electrode contact holes CTD and CTS may be located in the first emission area EMA surrounded by the third bank BNL3.

The second and third electrodes RME2 and RME3 may be second-type electrodes that are not directly connected to the fourth conductive layer, unlike first-type electrodes. The second-type electrodes may receive electrical signals applied directly to the first-type electrodes, via the light-emitting elements ED or the contact electrodes CNE. The second and third electrodes RME2 and RME3 may not be directly connected to the fourth conductive layer, but may be in a floating state, still being able to receive electrical signals from the fourth conductive layer.

As will be described later, the display device 10 may include subpixels PXn having different electrode configurations, and which of first-type electrodes and second-type electrodes are to be connected to the fourth conductive layer may be determined based on the electrode configuration of each of the subpixels PXn. For example, in a case where more second-type subpixels PX #2 are provided than there are first-type subpixels PX #1, the second electrode RME2 may be a first-type electrode directly connected to the fourth conductive layer, and the fourth electrode RME4 may be a second-type electrode.

For example, the width, in the second direction DR2, of the electrodes RME may be smaller than the width, in the second direction DR2, of the first banks BNL1. The electrodes RME may be disposed to cover at least one side surface of each of the first banks BNL1 and may thus be able to reflect light emitted by the light-emitting elements ED. The distance, in the second direction DR2, between the adjacent electrodes RME may be smaller than the distance between the sub-banks (BNL_A and BNL_B) of the first banks BNL1. At least parts of the electrodes RME may be disposed directly on the third interlayer insulating layer IL3 and may thus fall at the same plane.

The electrodes RME may be electrically connected to the light-emitting elements ED. The electrodes RME may be connected to both end portions of each of the light-emitting elements ED via the contact electrodes CNE that will be described later, and may transmit electrical signals applied from the fourth conductive layer to the light-emitting elements ED. Electrical signals for causing the light-emitting elements ED to emit light may be applied directly to the first and fourth electrodes RME1 and RME4, which are first-type electrodes, and may be transmitted to the other electrodes via the contact electrodes CNE and the light-emitting elements ED.

The electrodes RME may include a conductive material with high reflectance. For example, the electrodes RME may include a material with high reflectance, for example, a metal such as silver (Ag), Cu, or Al or an alloy of Al, Ni, or lanthanum (La). The electrodes RME may upwardly reflect light emitted by the light-emitting elements ED and then traveling toward the side surfaces of each of the first banks BNL1 or the side surfaces of the third bank BNL3.

However, the present disclosure is not limited to this. Alternatively, the electrodes RME may further include a transparent conductive material. For example, the electrodes RME may include a material such as ITO, IZO, or indium tin zinc oxide (ITZO). In some embodiments, the electrodes RME may be formed as a stack of more than one layer of a transparent conductive material and more than one metal layer with high reflectance or as single layers including a transparent conductive material and a metal with high reflectance. For example, the electrodes RME may have a stack of ITO/Ag/ITO/, ITO/Ag/IZO, or ITO/Ag/ITZO/IZO.

The first insulating layer PAS1 is disposed on the electrodes RME and the first banks BNL1. The first insulating layer PAS1 may be disposed to entirely cover the electrodes RME and the first banks BNL1 and may protect and insulate the electrodes RME from one another. Also, the first insulating layer PAS1 may prevent (or protect) the light-emitting elements ED disposed thereon from being in direct contact with, and damaged by, other members.

For example, the first insulating layer PAS1 may be formed to be recessed in part between each pair of electrodes RME spaced from each other in the second direction DR2. The light-emitting elements ED may be disposed on the top surface of part of the first insulating layer PAS1 that is recessed, and space may be formed between the light-emitting elements ED and the first insulating layer PAS1. However, the present disclosure is not limited to this example.

The first insulating layer PAS1 may include the contacts openings (CT1 and CT2), which expose parts of the top surfaces of the electrodes RME. The contacts (CT1 and CT2) may penetrate the first insulating layer PAS1, and the contact electrodes CNE that will be described later may be in contact with parts of the electrodes RME exposed by the contacts (CT1 and CT2).

The third bank BNL3 may be disposed on the first insulating layer PAS1. In a plan view, the third bank BNL3 may include parts that extend in the first direction DR1 and parts that extend in the second direction DR2 and may be arranged in a lattice pattern. The third bank BNL3 may be disposed along the boundaries between the subpixels PXn to define the subpixels PXn. The third bank BNL3 may be disposed to surround (or be around), and thereby define, the emission areas EMA and the subareas SA of the subpixels PXn. The parts of the third bank BNL3 that extend in the second direction DR2 may have a greater width between the emission areas EMA of the adjacent subpixels PXn than between the subareas SA of the subpixels PXn, but the present disclosure is not limited thereto. Alternatively, the parts of the third bank BNL3 that extend in the second direction DR2 may have a greater width between the adjacent subareas SA of the subpixels PXn than between the emission areas EMA of the adjacent subpixels PXn.

The third bank BNL3 may be formed to have a greater height than the first banks BNL1. The third bank BNL3 may prevent ink sprayed into one subpixel PXn from spilling over to other neighboring subpixels PXn during inkjet printing and may thereby prevent the ink from being mixed between different subpixels PXn. The third bank BNL3, like the first banks BNL1, may include polyimide, but the present disclosure is not limited thereto.

The light-emitting elements ED may be disposed on the first insulating layer PAS1. The light-emitting elements may be disposed to be spaced from one another in the direction in which the electrodes RME extend, i.e., in a first direction DR1, and may be aligned substantially in parallel to one another. The light-emitting elements ED may extend in one direction, and the direction in which the electrodes RME extend may form a substantially right angle with the direction in which the light-emitting elements ED extend. However, the present disclosure is not limited to this. Alternatively, the light-emitting elements ED may be arranged diagonally with respect to the direction in which the electrodes RME extend.

Each of the light-emitting elements ED may include semiconductor layers that are doped to have different conductivity types. As each of the light-emitting elements ED includes a plurality of semiconductor layers, the light-emitting elements ED may be aligned so that first end portions of each of the light-emitting elements ED may face a particular direction depending on the direction of an electric field formed on the electrodes RME. Also, each of the light-emitting elements ED may include a light-emitting layer 36 (see, for example, FIG. 13) and may thus emit light of a particular wavelength range. Light-emitting layers 36 of different light-emitting elements ED may emit light of different wavelength ranges depending on the material(s) thereof, but the present disclosure is not limited thereto. Alternatively, different light-emitting elements ED may emit light of the same color.

A plurality of layers may be arranged in each of the light-emitting elements ED in a direction parallel to the top surface of the first substrate SUB. The light-emitting elements ED may be arranged such that a direction in which the light-emitting elements ED extend may be parallel to the first substrate SUB, and the semiconductor layers included in each of the light-emitting elements ED may be sequentially arranged in a direction parallel to the top surface of the first substrate SUB. However, the present disclosure is not limited to this. Alternatively, the plurality of layers included in each of the light-emitting elements ED may be arranged in a direction perpendicular to the first substrate SUB.

The light-emitting elements ED may be disposed on the electrodes RME, which are spaced from each other in the second direction DR2, between the first banks BNL1. The length of the light-emitting elements ED may be greater than the distance, in the second direction DR2, between the electrodes RME, and both end portions of each of the light-emitting elements ED may be disposed on different electrodes RME. For example, the light-emitting elements ED may include first light-emitting elements ED1, which have both end portions disposed on the first and second electrodes RME1 and RME2 that are classified into a first electrode group RME #1, and second light-emitting elements ED2, which have both end portions disposed on the third and fourth electrodes RME3 and RME4 that are classified into a second electrode group RME #2.

As each of the light-emitting elements ED includes a plurality of semiconductor layers, first and second end portions of each of the light-emitting elements ED may be defined based on one of the semiconductor layers. The first and second end portions of each of the light-emitting elements ED may be disposed on different electrodes RME. For example, the first and second end portions of each of the first light-emitting elements ED1 may be disposed on the first and second electrodes RME1 and RME2, respectively, and the first and second end portions of each of the second light-emitting elements ED2 may be disposed on the third and fourth electrodes RME3 and RME4, respectively. The first and second end portions of each of the light-emitting elements ED may be electrically connected to different electrodes RME, but the present disclosure is not limited thereto. Alternatively, at least some of the light-emitting elements ED may have only one end portion thereof disposed on the electrodes RME or have the first and second end portions thereof disposed in different directions, depending on the direction in which they are aligned between the electrodes RME.

Both end portions of each of the light-emitting elements ED may be in contact with the contact electrodes CNE. As an insulating film 38 (see, for example, FIG. 13) is not formed at both ends of each of the light-emitting elements ED to expose parts of the semiconductor layers of each of the light-emitting elements ED, the exposed semiconductor layers may be in contact with the contact electrodes CNE, but the present disclosure is not limited thereto. Alternatively, at least part of the insulating film 38 may be removed so that parts of side surfaces of the semiconductor layers of each of the light-emitting elements ED may be exposed. The exposed side surfaces of the semiconductor layers may be in direct contact with the contact electrodes CNE. Both end portions of each of the light-emitting elements ED may be electrically connected to the electrodes RME via the contact electrodes CNE.

A second insulating layer PAS2 may be disposed on parts of the light-emitting elements ED. For example, the second insulating layer PAS2 may be disposed to surround parts of the outer surfaces of the light-emitting elements ED, but not to cover the first and second end portions of each of the light-emitting elements ED. As the second insulating layer PAS2 is disposed on the light-emitting elements ED extending in the second direction DR2, over the first insulating layer PAS1, in a plan view, the second insulating layer PAS2 may form linear or island patterns in the first subpixel PX1.

The second insulating layer PAS2 may be disposed directly on the first insulating layer PAS1, between the first banks BNL1 and the third bank BNL3. That is, the second insulating layer PAS2 may be disposed in the first emission area EMA1 not only on the light-emitting elements ED, but also on the first insulating layer PAS1 and the third bank BNL3 to expose both end portions of each of the light-emitting elements ED and the regions in which the electrodes RME are disposed. The second insulating layer PAS2 may be initially disposed on the entire surface of the first insulating layer PAS1 during the fabrication of the display device 10 and may then be partially removed to expose both end portions of each of the light-emitting elements ED. The second insulating layer PAS2 may protect and fix the light-emitting elements ED during the fabrication of the display device 10. Also, the second insulating layer PAS2 may be disposed to fill the space between the light-emitting elements ED and the first insulating layer PAS1.

Although not specifically illustrated, the second insulating layer PAS2 may be disposed in part in the first subarea SA1. The electrodes RME may be initially formed to extend in the first direction DR1 and be connected throughout the first subpixel PX1, and may then each be divided into two parts in the subarea SA after the alignment of the light-emitting elements ED and the formation of the second insulating layer PAS2. During the division of the electrodes RME, not only the electrodes RME, but also the first and second insulating layers PAS1 and PAS2 may be partially removed, and a third insulating layer PAS3 may be disposed directly on the third interlayer insulating layer IL3, in regions from which the electrodes RME and the first and second insulating layers PAS1 and PAS2 are partially removed. However, the present disclosure is not limited to this. Alternatively, the third insulating layer PAS3 may also be removed from the first subarea SA1 in which the electrodes RME are divided, and as a result, the third interlayer insulating layer IL3 may be partially exposed. Yet alternatively, another insulating layer disposed on the third insulating layer PAS3 to cover other elements may be disposed directly on the third interlayer insulating layer IL3.

The contact electrodes CNE and the third insulating layer PAS3 may be disposed on the second insulating layer PAS2. The contact electrodes CNE may be in contact with one end portion of each of the light-emitting elements ED and at least one of the electrodes RME. For example, the contact electrodes CNE may be in contact with one end portion of each of the light-emitting elements ED, exposed by the second insulating layer PAS2, and with at least one of the electrodes RME through contacts (CT1 and CT2), which are formed in the first insulating layer PAS1 to expose parts of the electrodes RME.

The contact electrodes CNE may include different types of contact electrodes that are electrically connected to different types of electrodes. For example, the contact electrodes CNE may include first-type contact electrodes, i.e., first and second contact electrodes CNE1 and CNE2, which are disposed on first-type electrodes, i.e., the first and fourth electrodes RME1 and RME4.

The first and second contact electrodes CNE1 and CNE2 may be disposed on parts of the first and fourth electrodes RME1 and RME4, respectively. The first and second contact electrodes CNE1 and CNE2 may extend in the first direction DR1 and may form linear patterns in the first emission area EMA1. The first contact electrode CNE1 may be in contact with the first electrode RME1 through a first contact CT1 that exposes the top surface of the first electrode RME1, and the second contact electrode CNE2 may be in contact with the fourth electrode RME4 through a first contact CT1 that exposes the top surface of the fourth electrode RME4. Also, the first contact electrode CNE1 may be in contact with the first end portions of the first light-emitting elements ED1, and the second contact electrode CNE2 may be in contact with the second end portions of the second light-emitting elements ED2.

The first and second contact electrodes CNE1 and CNE2, which are first-type contact electrodes, may transmit electrical signals applied to first-type electrodes to one end portion of each of the light-emitting elements ED. Electrical signals may be directly applied to the first end portions of the first light-emitting elements ED1 and the second end portions of the second light-emitting elements ED2 and may then be transmitted to other contact electrodes CNE and other light-emitting elements ED via the second end portions of the first light-emitting elements ED1 and the first end portions of the second light-emitting elements ED2.

The contact electrodes CNE may further include a second-type contact electrode, i.e., a third contact electrode CNE3, which is disposed across second-type electrodes, i.e., the second and third electrodes RME2 and RME3.

The third contact electrode CNE3 may be disposed on the second and third electrodes RME2 and RME3. The third contact electrode CNE3 may include first and second extensions CN_E1 and CN_E2, which extend in the first direction DR1, and a first connector CN_B1, which connect the first and second extensions CN_E1 and CN_E2, in the first separation part ROP1. The third contact electrode CNE3 may extend substantially in the first direction DR1 and may have a bent shape to be disposed on the second and third electrodes RME2 and RME3. The first extension CN_E1 may be disposed on the second electrode RME2 to be in contact with the second electrode RME2 and the first light-emitting elements ED1. The first extension CN_E1 may be in contact with the second end portions of the first light-emitting elements ED1 and part of the second electrode RME2 exposed by the second contact CT2. The second extension CN_E2 may be disposed on the third electrode RME3 to be in contact with the third electrode RME3 and the second light-emitting elements ED2. The second extension CN_E2 may be in contact with the first end portions of the second light-emitting elements ED2 and part of the third electrode RME3 exposed by the second contact CT2. The first connector CN_B1 may extend in the second direction DR2 in the first separation part ROP1.

The first light-emitting elements ED1 and the second light-emitting elements ED2 may be electrically connected via the third contact electrode CNE3. Electrical signals applied via the first contact electrode CNE1 may be transmitted to the second light-emitting elements ED2 via the first light-emitting elements ED1 and the third contact electrode CNE3. The light-emitting elements ED may be connected in series via second-type contact electrodes (e.g., the third contact electrode CNE3).

The contacts (CT1 and CT2), which are formed in areas where the contact electrodes CNE are in contact with the electrodes RME, may be disposed not to overlap with the light-emitting elements ED in the second direction DR2. For example, the contacts (CT1 and CT2) may be spaced from the region in which the light-emitting elements ED are disposed, in the first direction DR1, to be disposed adjacent to the parts of the third bank BNL3 that extend in the second direction DR2. The light-emitting elements ED emit light through both end portions thereof, and the contacts (CT1 and CT2) may be disposed to avoid the path of light emitted by the light-emitting elements ED, but the present disclosure is not limited thereto. The locations of the contacts (CT1 and CT2) may vary depending on the structures of the electrodes RME and the locations of the light-emitting elements ED.

FIGS. 5 and 6 illustrate that there are one first contact electrode CNE1, one second contact electrode CNE2, and one third contact electrode CNE3 disposed in the first subpixel PX1, but the present disclosure is not limited thereto. The number and shape of contact electrodes CNE may vary depending on the number of electrodes RME disposed in the first subpixel PX1.

The contact electrodes CNE may include a conductive material. For example, the contact electrodes CNE may include ITO, IZO, ITZO, or aluminum (Al). For example, the contact electrodes CNE may include a transparent conductive material, and light emitted from the light-emitting elements ED may pass through the contact electrodes CNE and may thus travel toward the electrodes RME. However, the present disclosure is not limited to this.

Some of the contact electrodes CNE may be disposed in the same layer, and other one contact electrodes CNE may be disposed in another layer. For example, the third contact electrode CNE3 may be disposed on the second insulating layer PAS2, and the first and second contact electrodes CNE1 and CNE2 may be disposed on the third insulating layer PAS3. The third contact electrode CNE3 may be disposed in an area in which the second insulating layer PAS2 is patterned and exposed, and the first and second contact electrodes CNE1 and CNE2 may be disposed in areas in which the second and third insulating layers PAS2 and PAS3 are patterned and exposed. The first and second contact electrodes CNE1 and CNE2 may be disposed directly on the first insulating layer PAS1 in areas in which the second and third insulating layers PAS2 and PAS3 are not disposed so that both end portions of each of the light-emitting elements ED are exposed.

The third insulating layer PAS3 is disposed on the third contact electrode CNE3. The third insulating layer PAS3 may also be disposed even on the entire second insulating layer PAS2, except for areas in which the first and second contact electrodes CNE1 and CNE2 are disposed. The third insulating layer PAS3 may insulate the first and second contact electrodes CNE1 and CNE2 from the third contact electrode CNE3 such that the first and second contact electrodes CNE1 and CNE2 are not in direct contact with the third contact electrode CNE3.

The third insulating layer PAS3 may be disposed between the first and second contact electrodes CNE1 and CNE2 to insulate the first and second contact electrodes CNE1 and CNE2 from each other. Alternatively, as already mentioned above, the third insulating layer PAS3 may not be provided, in which case, the first and second contact electrodes CNE1 and CNE2 may be disposed in the same layer.

Although not specifically illustrated, an insulating layer may be further disposed on the contact electrodes CNE, the third insulating layer PAS3, and the third bank BNL3 to cover the contact electrodes CNE, the third insulating layer PAS3, and the third bank BNL3. The insulating layer may be disposed on the entire surface of the first substrate SUB to protect the elements disposed on the first substrate SUB from an external environment.

The first, second, and third insulating layers PAS1, PAS2, and PAS3 may include an inorganic insulating material or an organic insulating material, but the present disclosure is not limited thereto.

The display device 10 may further include second-type subpixels PX #2, which have a different electrode configuration from first-type subpixels PX #1 described above with reference to FIGS. 5 and 6. Second-type subpixels PX #2 include more electrodes RME and more contact electrodes CNE than first-type subpixels PX #1 and can thus provide an increased number of serial connections between light-emitting elements ED.

A second-type subpixel PX #2 of a second pixel PXB will hereinafter be described with reference to FIGS. 8 and 9. Referring to FIGS. 8 and 9, subpixels PXn of a second pixel PXB may include more electrodes RME and more contact electrodes CNE than the subpixels PXn of the first pixel PXA of FIGS. 5-7. A fourth subpixel PX4 of the second pixel PXB differs from the first subpixel PX1 of the first pixel PXA of FIGS. 5-7 in that it includes a second bank BNL2 and includes relatively large numbers of electrodes RME and contact electrodes CNE. The fourth subpixel PX4 of FIGS. 8 and 9 will hereinafter be described, focusing mainly on the differences with the first subpixel PX1 of FIGS. 5-7.

The fourth subpixel PX4 of the second pixel PXB may further include the second bank BNL2, which is disposed between each pair of first banks BNL1 spaced from each other in the second direction DR2. The second bank BNL2, like the first banks BNL1, may be disposed directly on the third interlayer insulating layer IL3. The second bank BNL2 may extend in the first direction DR1 and may have a relatively large width in part on a fourth emission area EMA4 of the fourth subpixel PX4. For example, parts of the second bank BNL2 that face the first banks BNL1 may be formed to have a relatively large width, and the second bank BNL2 may extend in the first direction DR1 between first sub-banks BNL_A and second sub-banks BNL_B. The second bank BNL2, unlike the first banks BNL1, may extend even into a fourth subarea SA4 of the fourth subpixel PX4, beyond the fourth emission area EMA4. The second bank BNL2 may be disposed even in neighboring subpixels PXn, in the first direction DR1, of the fourth subpixel PX4 to form a linear pattern throughout the entire display area DPA.

The fourth subpixel PX4 may include first and second electrode groups RME #1 and RME #2, and the first and second electrode groups RME #1 and RME #2 may include more electrodes than their respective counterparts of FIGS. 5-7. The first electrode group RME #1 may include first and second electrodes RME1 and RME2 and may further include fifth and sixth electrodes RME5 and RME6, and the second electrode group RME #2 may include third and fourth electrodes RME3 and RME4 and may further include seventh and eighth electrodes RME7 and RME8.

The fourth subpixel PX4 (i.e., a second-type subpixel PX #2), unlike the first subpixel PX1 of FIGS. 5-7 (i.e., a first-type subpixel PX #1), may have the second electrode RME2 (i.e., a first-type electrode) directly connected to a second voltage line VL2 via a second electrode contact hole CTS. The fourth electrode RME4, which is a second-type electrode, may not be directly connected to the fourth conductive layer. The second and fourth electrodes RME2 and RME4 may be spaced from the first and third electrodes RME1 and RME3 and may be disposed adjacent to the center of the fourth emission area EMA4. The second and fourth electrodes RME2 and RME4 may be disposed in part on one side of the second bank BNL2 that faces the second sub-banks BNL_B.

The fifth electrode RME5 may be disposed between the first and second electrodes RME1 and RME2. The fifth electrode RME5 may be spaced from, and face, the first electrode RME1, and may be disposed on the second bank BNL2 to be spaced from the second electrode RME2. The fifth electrode RME5 may be disposed in part on the other side of the second bank BNL2 that faces the first sub-bank BNL_A on the upper side of the fourth emission area EMA4. The sixth electrode RME6 may be spaced from, and face, the second electrode RME2 and may be disposed on the upper right side of the center of the fourth emission area EMA4. The sixth electrode RME6 may be disposed in part on the second sub-bank BNL_B on the upper side of the fourth emission area EMA4.

The seventh electrode RME7 may be disposed between the third and fourth electrodes RME3 and RME4 and may be spaced from the fifth electrode RME5 in the first direction DR1. The seventh electrode RME7 may be spaced from, and face, the third electrode RME3 and may be disposed on the second bank BNL2 to be spaced from the fourth electrode RME4. The seventh electrode RME7 may be disposed in part on the other side of the second bank BNL2 that faces the first sub-bank BNL_A on the lower side of the fourth emission area EMA4. The eighth electrode RME8 may be spaced from, and face, the fourth electrode RME4 and may be disposed on the lower right side of the center of the fourth emission area EMA4. The eighth electrode RME8 may be disposed in part on the second sub-bank BNL_B on the lower side of the fourth emission area EMA4.

The fifth, sixth, seventh, and eighth electrodes RME5, RME6, RME7, and RME8 may be second-type electrodes that are not directly connected to the fourth conductive layer, unlike first-type electrodes. The distance, in the second direction DR2, between the electrodes RME may be smaller than the distance between the first banks BNL1 and the second bank BNL2. At least parts of the electrodes RME may be disposed directly on the third interlayer insulating layer IL3 and may thus fall on the same plane.

As the fourth subpixel PX4, which is a second-type subpixel PX #2, includes a relatively large number of electrodes RME, the fourth subpixel PX4 may include light-emitting elements ED that can configure a relatively large number of serial connections. For example, the fourth subpixel PX4 may include first light-emitting elements ED1, which have both end portions disposed on the first and fifth electrodes RME1 and RME5, second light-emitting elements ED2, which have both end portions disposed on the second and sixth electrodes RME2 and RME6, third light-emitting elements ED3, which have both end portions disposed on the third and seventh electrodes RME3 and RME7, and fourth light-emitting elements ED4, which have both end portions disposed on the fourth and eighth electrodes RME4 and RME8.

First end portions of the first light-emitting elements ED1 may be disposed on the first electrode RME1, and second end portions of the first light-emitting elements ED1 may be disposed on the fifth electrode RME5. First end portions of the second light-emitting elements ED2 may be disposed on the sixth electrode RME6, and second end portions of the second light-emitting elements ED2 may be disposed on the second electrode RME2. Similarly, first end portions of the third light-emitting elements ED3 may be disposed on the third electrode RME3, and second end portions of the third light-emitting elements ED3 may be disposed on the seventh electrode RME7. First end portions of the fourth light-emitting elements ED4 may be disposed on the eighth electrode RME8, and second end portions of the fourth light-emitting elements ED4 may be disposed on the fourth electrode RME4.

As the fourth subpixel PX4, which is a second-type subpixel PX #2, includes light-emitting elements ED that can form a relatively large number of serial connections, the fourth subpixel PX4 may include a relatively large number of contact electrodes CNE accordingly. The contact electrodes CNE may include first, second, and third contact electrodes CNE1, CNE2, and CNE3 and may further include fourth and fifth contact electrodes CNE4 and CNE5.

The first and second contact electrodes CNE1 and CNE2 may be disposed in part on the first and second electrodes RME1 and RME2, respectively. The first contact electrode CNE1 may be in contact with the first end portions of the first light-emitting elements ED1, and the second contact electrode CNE2 may be in contact with the second end portions of the second light-emitting elements ED2.

The third contact electrode CNE3 may be disposed on the third and fifth electrodes RME3 and RME5. The third contact electrode CNE3 may include a first extension CN_E1, which is disposed on the fifth electrode RME5, a second extension CN_E2, which is disposed on the third electrode RME3, and a first connector CN_B1, which connects the first and second extensions CN_E1 and CN_E2 and is disposed in a first separation part ROP1. The first extension CN_E1 may be in contact with the second end portions of the first light-emitting elements ED1 and part of the fifth electrode RME5 exposed by a second contact CT2. The second extension CN_E2 may be in contact with the first end portions of the third light-emitting elements ED3 and part of the third electrode RME3 exposed by another second contact CT2.

The fourth contact electrode CNE4 may be disposed on the seventh and eighth electrodes RME7 and RME8. The fourth contact electrode CNE4 may include third and fourth extensions CN_E3 and CN_E4, which extend in the first direction, and a second connector CN_B2, which connects the third and fourth extensions CN_E3 and CN_E4, on the lower side of the fourth emission area EMA4. The second connector CN_B2 may connect the third and fourth extensions CN_E3 and CN_E4 in an area other than the first separation part ROP1. The third extension CN_E3 may be disposed on the seventh electrode RME7 to be in contact with the seventh electrode RME7 and the second end portions of the third light-emitting elements ED3. The fourth extension CN_E4 may be disposed on the eighth electrode RME8 to be in contact with the eighth electrode RME8 and the first end portions of the fourth light-emitting elements ED4. The fourth contact electrode CNE4 may be spaced from a fifth extension CN_E5 of the fifth contact electrode CNE5 to surround (or be around) the fifth extension CN_E5 of the fifth contact electrode CNE5.

The fifth contact electrode CNE5 may have a similar shape to the third contact electrode CNE3 and may be disposed on the fourth and sixth electrodes RME4 and RME6. The fifth contact electrode CNE5 may include the fifth extension CN_E5 and a sixth extension CN_E6, which extend in the first direction DR1, and a third connector CN_B3, which connect the fifth and sixth extensions CN_E5 and CN_E6, in the first separation part ROP1 of the fourth emission area EMA4. The fifth extension CN_E5 may be disposed on the fourth electrode RME4 to be in contact with the fourth electrode RME4 and the second end portions of the fourth light-emitting elements ED4, and the sixth extension CN_E6 may be disposed on the sixth electrode RME6 to be in contact with the sixth electrode RME6 and the first end portions of the second light-emitting elements ED2. The third connector CN_B3 may extend in the second direction DR2, in the first separation part ROP1.

The first light-emitting elements ED1 and the third light-emitting elements ED3 may be electrically connected by the third contact electrode CNE3. Electrical signals may be transmitted to the fourth light-emitting elements ED4 and the second light-emitting elements ED2 via the fourth and fifth contact electrodes CNE4 and CNE5. The light-emitting elements ED disposed in the fourth subpixel PX4 may be connected in series via second-type contact electrodes.

As second-type subpixels PX #2 include more electrodes than first-type subpixels PX #1, the number of serial connections between light-emitting elements ED can be increased. The display device 10 may include different types of groups of subpixels having different electrode configurations and different types of serial connections between light-emitting elements ED, i.e., first-type subpixels PX #1 and second-type subpixels PX #2, for the purpose of compensating for the distribution of inkjet printing processes for arranging light-emitting elements ED during the fabrication of the display device 10.

Figure 10:
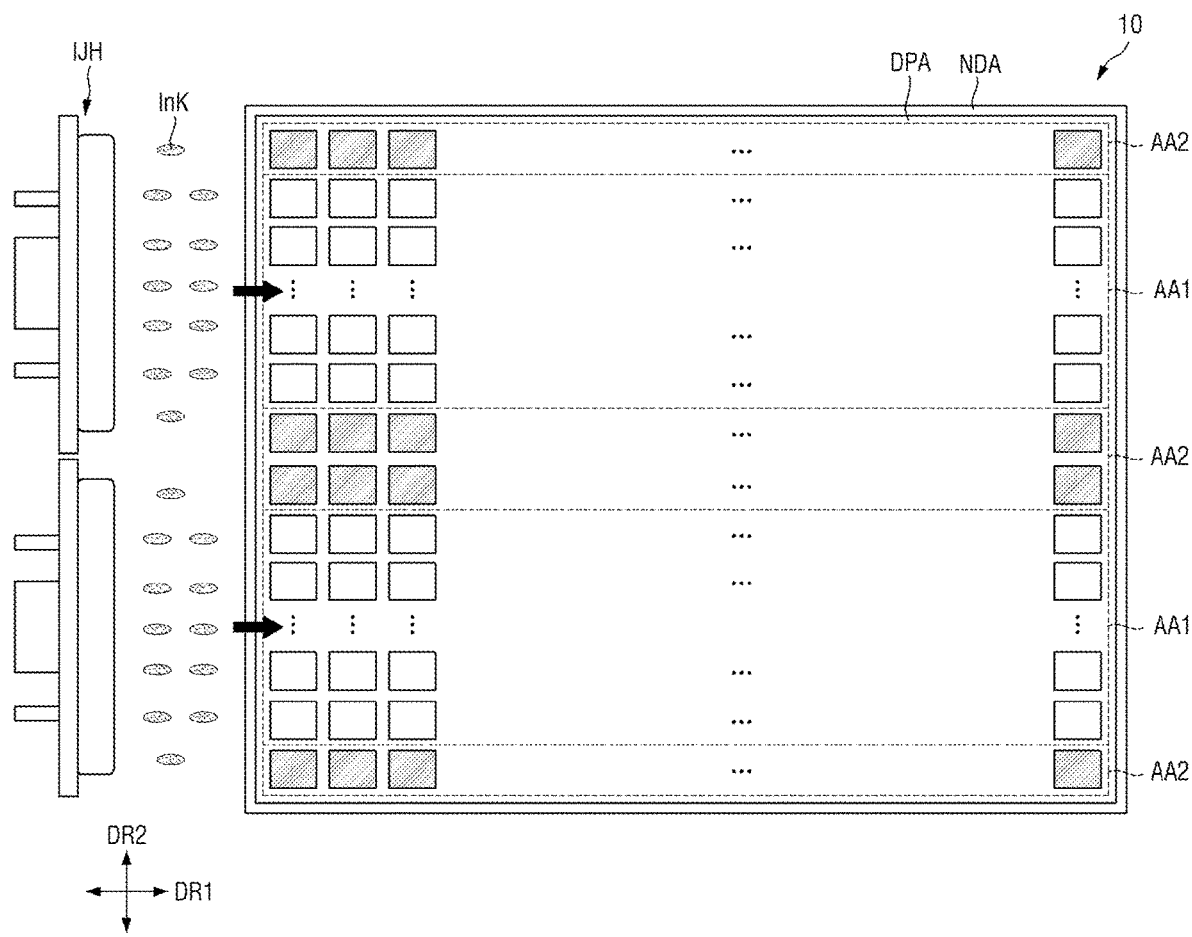
FIGS. 10 and 11 are layout views illustrating an inkjet printing process performed during the fabrication of the display device of FIG. 1.
Figure 11:
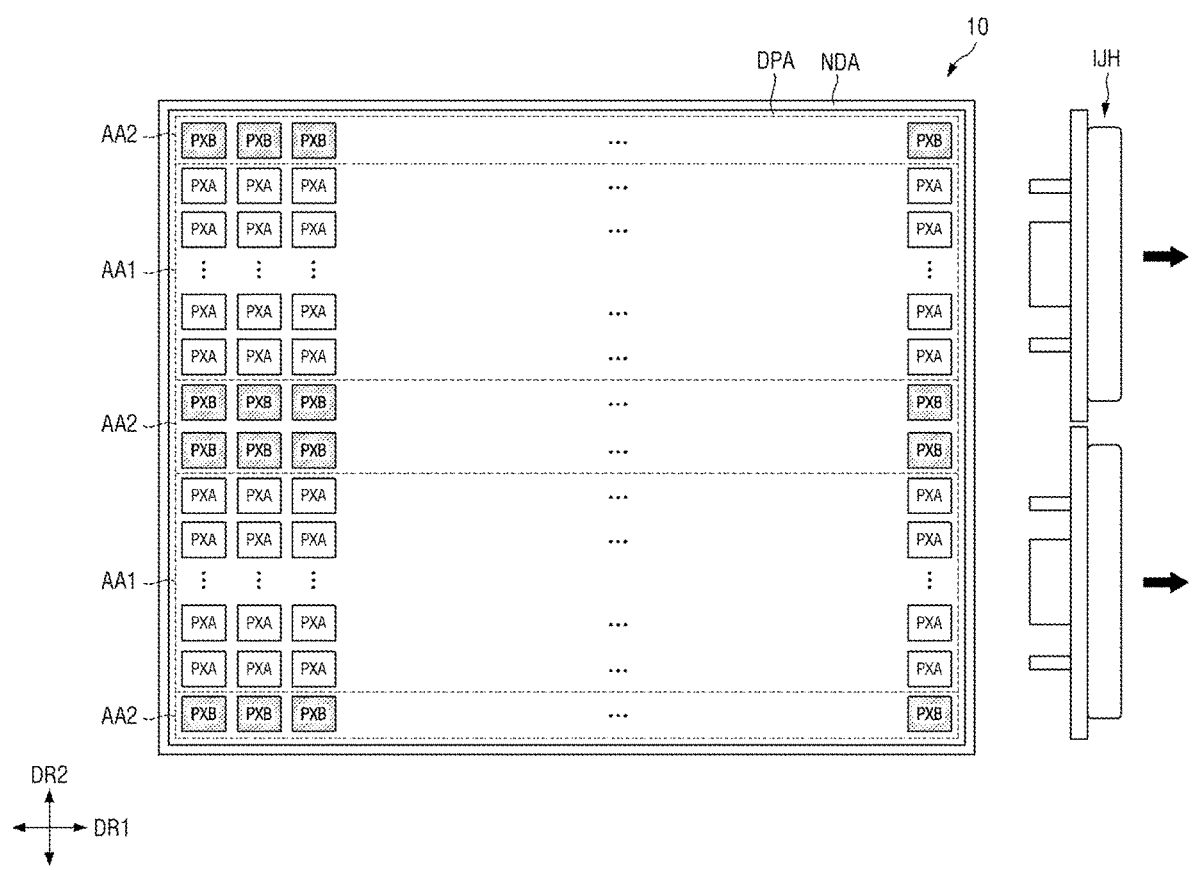

FIGS. 10 and 11 are layout views illustrating an inkjet printing process performed during the fabrication of the display device of FIG. 1.

Referring to FIGS. 10 and 11, the fabrication of the display device 10 may include printing ink "Ink" including light-emitting elements ED onto the display area DPA. The printing of the ink may be performed using inkjet printing devices IJH. For example, the inkjet printing devices IJH may spray the ink "Ink" onto the display area DPA while moving in one direction. In a case where the display device 10 extends longer in the first direction DR1 than in the second direction DR2, multiple inkjet printing devices IJH may spray the ink "Ink" while moving in the first direction DR1.

Each of the inkjet printing devices IJH may include a plurality of nozzles (not illustrated) via which the ink "Ink" is ejected, and the amount of ink "Ink" ejected from each of the nozzles and the number of light-emitting elements ED included in each unit ink "Ink" may be uniformly controlled (or substantially uniformly controlled). However, there may arise a discrepancy in the amount of ink "Ink" ejected between the nozzles of each of the inkjet printing devices IJH depending on the performance of the inkjet printing devices IJH, for example, a smaller amount of ink "Ink" may be ejected from the outermost nozzles than from the middle nozzles of each of the inkjet printing devices IJH. As a result, when the inkjet printing devices IJH spray the ink "Ink" while moving in one direction, smaller numbers of light-emitting elements ED may be located in areas onto which the ink "Ink" is sprayed from the outermost nozzles of each of the inkjet printing devices IJH than in other areas.

Referring to FIGS. 10 and 11 and further to FIGS. 3 and 4, the ink "Ink" may be sprayed from the middle nozzles of each of the inkjet printing devices IJH onto the first areas AA1, in which first pixels PXA are arranged, and uniform numbers of light-emitting elements ED may be arranged in the first-type subpixels PX #1 of each of the first pixels PXA. On the contrary, the ink "Ink" may be sprayed from the outermost nozzles of each of the inkjet printing devices IJH onto the second areas AA2, in which second pixels PXB are arranged, and relatively smaller numbers of light-emitting elements ED may be arranged in the second-type subpixels PX #2 of each of the second pixels PXB than in the first-type subpixels PX #1 of each of the first pixels PXA.

The number of light-emitting elements ED illustrated in each of FIGS. 5-8 may not necessarily be the same as the actual number of light-emitting elements ED disposed in each subpixel PXn. For example, FIG. 5 illustrates that a total of ten light-emitting elements ED are provided in the emission area EMA of each first-type subpixel PX #1, and FIG. 8 illustrates that a total of eight light-emitting elements ED are provided in the emission area EMA of each second-type subpixel PX #2. However, the numbers of light-emitting elements in each first-type subpixel PX #1 and each second-type subpixel PX #2 are not particularly limited, but each first-type subpixel PX #1 and each second-type subpixel PX #2 may include more than, or less than, ten light-emitting elements ED and more than, or less than, eight light-emitting elements ED, respectively.

When subpixels PXn have the same number of light-emitting elements ED, the subpixels PXn may be interpreted as having substantially the same number of light-emitting elements ED. On the contrary, when subpixels PXn have different numbers of light-emitting elements ED, one of the subpixels PXn may be interpreted as having a greater number of light-emitting elements ED than other subpixels PXn. That is, the number of light-emitting elements ED in each of FIGS. 5-8 represents the ratio or the relative difference between different pixels PX or different subpixels PXn in terms of the number of light-emitting elements ED, but does not necessarily represent the actual number of light-emitting elements disposed in each subpixel PXn.

The size of the emission area EMA of each subpixel PXn, surrounded by the third bank BNL3, may be uniform regardless of the type of each pixel PX or each subpixel PXn. Even if each first-type subpixel PX #1 and each second-type subpixel PX #2 have different electrode configurations, the third bank BNL3 may have a uniform shape, and as a result, the emission area EMA of each subpixel PXn may have a uniform size. First-type subpixels PX #1 having a relatively large number of light-emitting elements ED in their respective emission areas EMA may be arranged in the first areas AA1 of the display area DPA, and second-type subpixels PX #2 having a relatively small number of light-emitting elements ED in their respective emission areas EMA may be arranged in the second areas AA2 of the display area DPA. The number of light-emitting elements ED per unit area of each emission area EMA may be greater in the first-type subpixels PX #1 than in the second-type subpixels PX #2.

Here, the term "the number of light-emitting elements ED per unit area of each emission area EMA" may mean the number of light-emitting elements ED disposed in the emission area EMA of each subpixel PXn, surrounded by the third bank BNL3, but the present disclosure is not limited thereto. As already mentioned above, light-emitting elements ED may be electrically connected to electrodes RME and may thus receive electrical signals from a circuit layer disposed therebelow. Each subpixel PXn may have a luminance provided by light-emitting elements ED thereof that are electrically connected to electrodes RME to properly emit light, and different pixels PX may have different luminances depending on their number of light-emitting elements ED that are electrically connected to electrodes RME.

That is, the term "the number of light-emitting elements ED per unit area of each emission area EMA" may mean the number of light-emitting elements ED that are electrically connected to electrodes RME within each emission area EMA. However, if the ratio of the number of light-emitting elements ED electrically connected to electrodes RME to the number of light-emitting elements ED disposed in each emission area EMA is uniform (or substantially uniform) between different pixels PX, the relative ratio of the number of light-emitting elements ED electrically connected to electrodes RME to the number of light-emitting elements ED disposed in each emission area EMA may be substantially the same between different pixels PX.

The expression "the number of light-emitting elements ED is the same between different pixels PX or between different subpixels PXn" or "the size of each emission area EMA is the same between different pixels PX or between different subpixels PXn", as used herein, means not only that the number of light-emitting elements ED or the size of each emission area EMA is exactly the same between different pixels PX or between different subpixels PXn, but also that the number of light-emitting elements ED or the size of each emission area EMA is almost uniform within an error range (e.g., a set or predetermined error range). On the contrary, the expression "the number of light-emitting elements ED is not the same (or different) between different pixels PX or between different subpixels PXn" or "the size of each emission area EMA is not the same (or different) between different pixels PX or between different subpixels PXn", as used herein, encompasses that the number of light-emitting elements ED or the size of each emission area EMA is clearly different between different pixels PX or between different subpixels PXn, beyond an error range (e.g., a set or predetermined error range). That is, the expression "the size of each emission area EMA or the number of light-emitting elements ED is not the same or not uniform between different pixels PX or between different subpixels PXn", as used herein, may mean that there may exist a significant difference in the size of each emission area EMA or the number of light-emitting elements ED between different pixels PX or between different subpixels PXn.

As different types of groups of subpixels (PX #1 and PX #2) or different types of groups of pixels (PXA and PXB) are arranged in accordance with the distribution of the inkjet printing devices IJH, the first areas AA1 and the second areas AA2 may have a shape corresponding to the distribution of the inkjet printing devices IJH. In a case where the display device 10 extends longer in the first direction DR1 than in the second direction DR2, the inkjet printing devices IJH may move in the first direction DR1, and the first areas AA1 and the second areas AA2 may be formed to extend in the first direction DR1 accordingly. The first areas AA1 and the second areas AA2 may have the same length in the first direction DR1, but may have different widths in the second direction DR2 depending on the shape and the size of the inkjet printing devices IJH.

Referring to FIGS. 10 and 11 and further to FIG. 2, a plurality of first areas AA1 and a plurality of second areas AA2 may be formed in the display area DPA of the display device 10 and may be alternately arranged in the second direction DR2. Because the first areas AA1 and the second areas AA2 each consist of one or more pixel rows, first pixels PXA, each including first-type subpixels PX #1, and second pixels PXB, each including second-type subpixels PX #2, may not be alternately arranged in the second direction DR2. The first pixels PXA may be adjacent to one another in the first areas AA1 in the second direction DR2, but may be adjacent to the second pixels PXB at the boundaries between the first areas AA1 and the second areas AA2.

The first areas AA1, which are formed in the display area DPA, may have the same size. The first areas AA1, which are areas into which an ink "Ink" (e.g., a set or predetermined amount of ink "Ink") is sprayed and then settles, may occupy a relatively large portion of the display area DPA. The first areas AA1 may be spaced from one another by one of the second areas AA2 and may be spaced from the non-display area NDA, along the second direction DR2, by the other second areas AA2.

The second areas AA2, unlike the first areas AA1, may have different sizes. In a case where the display device 10 extends longer in the first direction DR1 than in the second direction DR2, second areas AA2 in the outermost parts of the display area DPA may have a smaller size than a second area AA2 in the middle of the display area DPA. The second area AA2 in the middle of the display area DPA may be located between the first areas AA1. As already mentioned above, the distribution of the inkjet printing devices IJH is highly likely to occur in the outermost nozzles of each of the inkjet printing devices IJH, and thus, second-type subpixels PX #2 may be arranged at locations corresponding to the outermost nozzles of each of the inkjet printing devices IJH.

Because the inkjet printing devices IJH can perform printing at the same time, the ink "Ink" may be printed onto a middle part of the display area DPA by different inkjet printing devices IJH and may be printed onto each of the outermost parts of the display area DPA by one inkjet printing device IJH. As a result, at least two rows of second-type subpixels PX #2 may be arranged in the second area AA2 in the middle of the display area DPA to correspond to outermost nozzles of two different inkjet printing devices IJH. Accordingly, the width, in the second direction DR2, of the second area AA2 between the first areas AA1 may be greater than the width, in the second direction DR2, of the second areas AA2 in the outermost parts of the display area DPA.

In some embodiments, the width, in the second direction DR2, of arrays of two second pixels PXB and a plurality of first pixels PXA disposed between the two second pixels PXB may be the same as the width, in the second direction DR2, of each of the inkjet printing devices IJH. As already mentioned above, because second-type subpixels PX #2 are arranged at the locations corresponding to the outermost nozzles of each of the inkjet printing devices IJH, two rows of second pixels PXB that are spaced from each other and a plurality of rows of first pixels PXA that are disposed between the two rows of second pixels PXB may be formed by the ink "Ink" ejected by each of the inkjet printing devices IJH, but the present disclosure is not limited thereto.

As already mentioned above, first-type subpixels PX #1 and second-type subpixels PX #2 may have different electrode configurations and may have different numbers of serial connections between a plurality of light-emitting elements ED. The first-type subpixel PX #1 of FIG. 5 may have a two-stage serial structure in which the first light-emitting elements ED1 and the second light-emitting elements ED2 are connected in series, and the second-type subpixel PX #2 of FIG. 8 may have a four-stage serial structure in which the first light-emitting elements ED1, the second light-emitting elements ED2, the third light-emitting elements ED3, and the fourth light-emitting elements ED4 are connected in series. Even if the number of light-emitting elements ED disposed per unit area of the emission area EMA of each second-type subpixel PX #2 is smaller than the number of light-emitting elements ED disposed per unit area of the emission area EMA of each first-type subpixel PX #1, the number of serial connections between light-emitting elements ED may be greater in each second-type subpixel PX #2 than in each first-type subpixel PX #1, and thus, the luminance per unit area of each second-type subpixel PX #2 may be higher than the luminance per unit area of each first-type subpixel PX #1. Even if there exist pixels PX with only a small number of light-emitting elements ED due to the distribution of the inkjet printing devices IJH, the pixels PX may be designed to have an electrode configuration corresponding to the distribution of ink "Ink" from the inkjet printing devices IJH and can thus be prevented from having low luminance due to the distribution of ink "Ink" from the inkjet printing devices IJH.

As first-type subpixels PX #1 and second-type subpixels PX #2 have different electrode configurations, there may arise differences in luminance between the first-type subpixels PX #1 and the second-type subpixels PX #2. However, the display device 10 can have uniform luminance at any location in the display area DPA, regardless of the differences in the number of light-emitting elements ED and the number of serial connections between the light-emitting elements between different types of groups of subpixels (PX #1 and PX #2), by correcting driving signals for the different types of groups of subpixels (PX #1 and PX #2).

Figure 12:
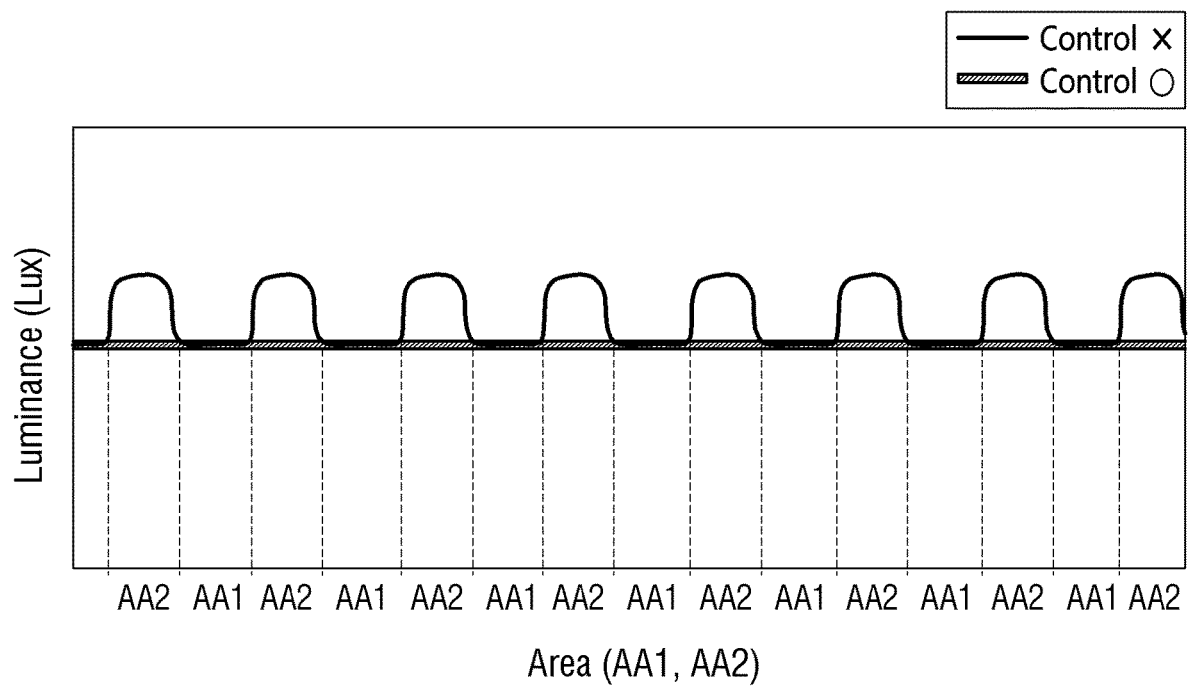
FIG. 12 is a graph showing the luminances of first areas and second areas of the display device of FIG. 1.

FIG. 12 is a graph showing the luminances of first areas and second areas of the display device of FIG. 1.

Referring to FIG. 12, the first areas AA1, in which first-type subpixels PX #1 are arranged, and the second areas AA2, in which second-type subpixels PX #2 are arranged, may have different luminances depending on the number of light-emitting elements ED and the number of serial connections between the light-emitting elements ED. Because the number of serial connections between light-emitting elements ED is greater in the second areas AA2 having a relatively small number of light-emitting elements ED per unit area of each emission area EMA than in the first areas AA1, the second areas AA2 may have higher luminance than the first areas AA1 (see "Control X"). If the luminance of the second-type subpixels PX #2 in the second areas AA2 is corrected based on the luminance of the first-type subpixels PX #1 in the first areas AA1 during the driving of the display device 10 (see "Control O"), the display device 10 can have uniform luminance at any location in the display area DPA, regardless of the type of subpixels PXn at a corresponding location in the display area DPA.

For example, as subpixels PXn with a relatively small number of light-emitting elements ED are designed to have a different electrode configuration from other subpixels PXn in accordance with the distribution of the inkjet printing devices IJH, the subpixels PXn with a relatively small number of light-emitting elements ED can have higher luminance than other subpixels PXn. Even if the luminance of subpixels PXn is corrected based on subpixels PXn having relatively low luminance, the subpixels PXn can have similar luminance to that designed, and as a result, the display device 10 still can have high luminance regardless of the correction of the luminance of the subpixels PXn.

Figure 13:
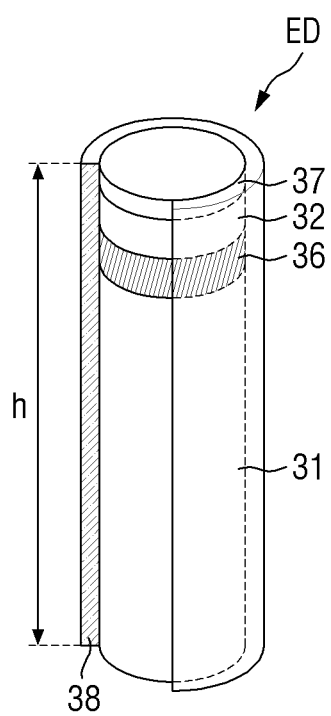
FIG. 13 is a perspective cutaway view of a light-emitting element according to an embodiment of the present disclosure.

FIG. 13 is a perspective cutaway view of a light-emitting element according to an embodiment of the present disclosure.

Referring to FIG. 13, a light-emitting element ED may be a light-emitting diode (LED), for example, an ILED having a size of several nanometers or micrometers and formed of an inorganic material. If an electric field is formed in a particular direction between two opposite electrodes, the light-emitting element ED may be aligned between the two electrodes where polarities are formed.

The light-emitting element ED may have a shape that extends in one direction. The light-emitting element ED may have the shape of a cylinder, a rod, a wire, or a tube, but the shape of the light-emitting element ED is not particularly limited. Alternatively, the light-emitting element ED may have the shape of a polygonal column such as a regular cube, a rectangular parallelepiped, or a hexagonal column or may have a shape that extends in one direction but with a partially inclined outer surface.

The light-emitting element ED may include semiconductor layers doped with impurities of an arbitrary conductivity type (e.g., a p type or an n type). The semiconductor layers may receive electrical signals from an external power source to emit light of a particular wavelength range. The light-emitting element ED may include a first semiconductor layer 31, a second semiconductor layer 32, the light-emitting layer 36, an electrode layer 37, and the insulating film 38.

The first semiconductor layer 31 may include an n-type semiconductor. The first semiconductor layer 31 may include a semiconductor material $Al_xGa_yIn_{1-x-y}N$ (where $0 \le x \le 1$, $0 \le y \le 1$, and $0 \le x+y \le 1$). For example, the semiconductor material $Al_xGa_yIn_{1-x-y}N$ may be at least one of AlGaInN, GaN, AlGaN, InGaN, AlN, and InN that are doped with an n-type dopant. The first semiconductor layer 31 may be doped with an n-type dopant, and the n-type dopant may be Si, Ge, or Sn. However, the present disclosure is not limited to this. A first end portion of the light-emitting element ED may be part of the light-emitting element ED where the first semiconductor layer 31 is disposed with respect to the light-emitting layer 36.

The second semiconductor layer 32 may be disposed on the light-emitting layer 36. The second semiconductor layer 32 may include a p-type semiconductor. The second semiconductor layer 32 may include a semiconductor material $Al_xGa_yIn_{1-x-y}N$ (where $0 \le x \le 1$, $0 \le y \le 1$, and $0 \le x+y \le 1$). For example, the semiconductor material $Al_xGa_yIn_{1-x-y}N$ may be at least one of AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, or Ba. However, the present disclosure is not limited to this. A second end portion of the light-emitting element ED may be part of the light-emitting element ED where the second semiconductor layer 32 is disposed with respect to the light-emitting layer 36.

FIG. 13 illustrates that the first and second semiconductor layers 31 and 32 are formed as single layers, but the present disclosure is not limited thereto. Alternatively, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. The light-emitting layer 36 may include a material such as AlGaN or AlGaInN. For example, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN.

However, the present disclosure is not limited to this. Alternatively, the light-emitting layer 36 may have a structure in which a semiconductor material having a large band gap energy and a semiconductor material having a small band gap energy are alternately stacked or may include Group-III or Group-V semiconductor materials depending on the wavelength of light to be emitted. The type of light emitted by the light-emitting layer 36 is not particularly limited. The light-emitting layer 36 may emit light of a red or green wavelength range as necessary, instead of blue light.

The electrode layer 37 may be an ohmic contact electrode, but the present disclosure is not limited thereto. Alternatively, the electrode layer 37 may be a Schottky contact electrode. The light-emitting element ED may include at least one electrode layer 37. The light-emitting element ED may include more than one electrode layer 37, but the present disclosure is not limited thereto. Alternatively, the electrode layer 37 may not be provided.

The electrode layer 37 may reduce the resistance between the light-emitting element ED and electrodes (or contact electrodes) when the light-emitting element ED is electrically connected to the electrodes (or the contact electrodes). The electrode layer 37 may include a conductive metal. For example, the electrode layer 37 may include at least one of Al, Ti, In, gold (Au), Ag, ITO, IZO, and ITZO. However, the present disclosure is not limited to this.

The insulating film 38 may be disposed to surround the first and second semiconductor layers 31 and 32 and the electrode layer 37 along the outer peripheral surface of the first and second semiconductor layers 31 and 32 and the electrode layer 37. For example, the insulating film 38 may be disposed to surround at least the light-emitting layer 36, but to expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as, for example, silicon oxide ($SiO_x$), silicon nitride ($SiN_x$), silicon oxynitride ($SiO_xN_y$), aluminum nitride ($AlN_x$), or aluminum oxide ($AlO_x$). The insulating film 38 is illustrated as being a single-layer film, but the present disclosure is not limited thereto. Alternatively, in some embodiments, the insulating film 38 may be formed as a multilayer film in which multiple layers are stacked.

The insulating film 38 may protect the other elements of the light-emitting element ED. The insulating film 38 can prevent any short circuit that may occur in the light-emitting element 36 in case that the light-emitting element ED is in direct contact with electrodes to which electrical signals are applied. Also, the insulating film 38 can prevent (or reduce) the degradation of the emission efficiency of the light-emitting element ED.

The outer surface of the insulating film 38 may be subjected to surface treatment. The light-emitting element ED may be sprayed on electrodes while being scattered in an ink (e.g., a set or predetermined ink). Here, the surface of the insulating film 38 may be hydrophobically or hydrophilically treated to keep the light-emitting element ED scattered in ink without agglomerating with other neighboring light-emitting elements ED.

In a case where the display device 10 extends longer in the first direction DR1 than in the second direction DR2, the inkjet printing devices IJH may spray the ink "Ink" while moving in the first direction DR1. Accordingly, subpixels PXn of the same type, i.e., first subpixels PX #1 or second subpixels PX #2, may be arranged in the first direction DR1, and electrodes RME may extend in the same direction as the direction in which the subpixels PXn of the same type are arranged. That is, the electrodes RME of the display device 10 may also have a shape and structure corresponding to a printing process performed by the inkjet printing devices IJH.

Figure 14:
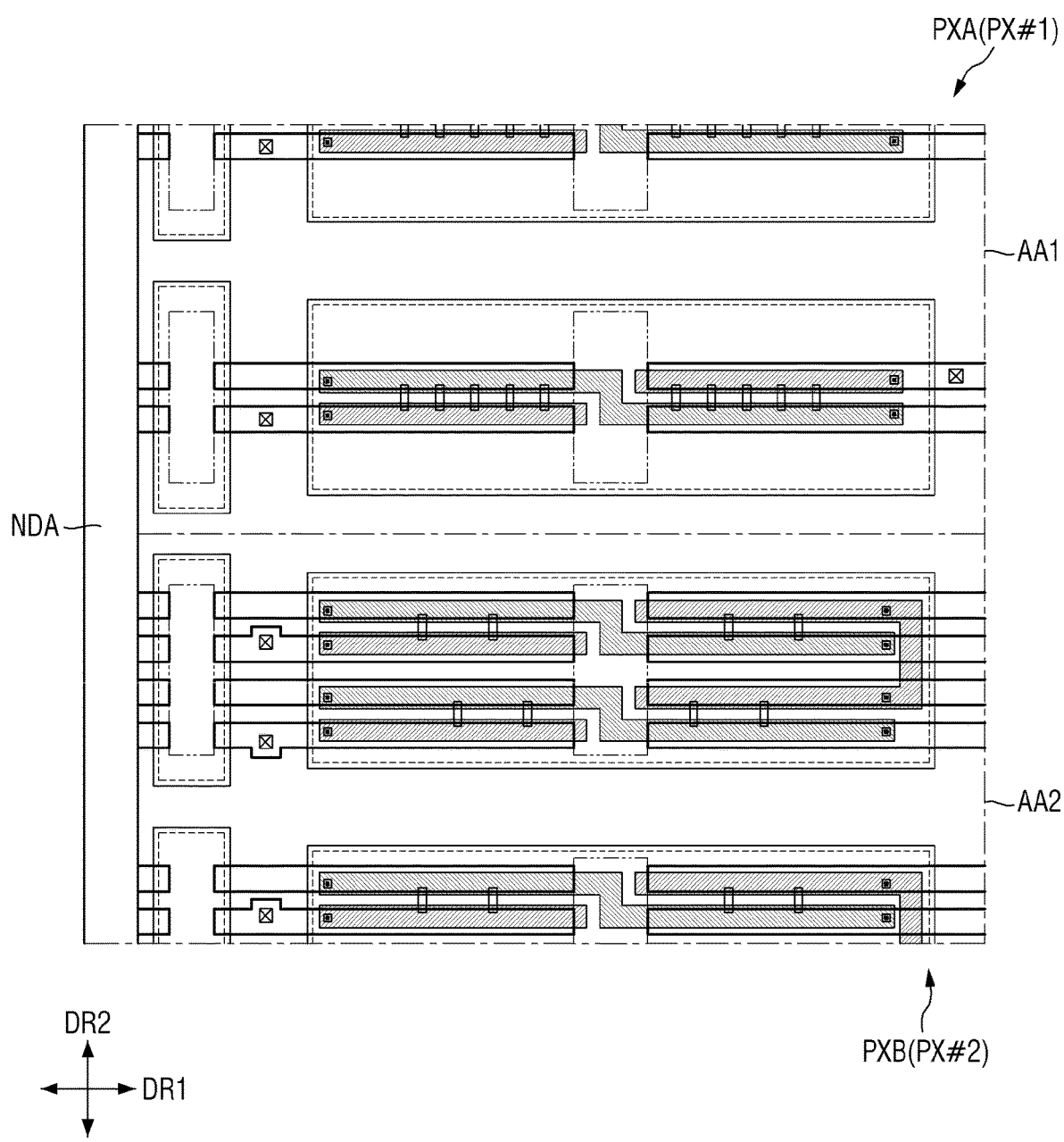
FIG. 14 is a layout view illustrating the arrangement of subpixels at the boundary between first and second areas of the display device of FIG. 2.

FIG. 14 is a layout view illustrating the arrangement of subpixels along first and second areas of the display device of FIG. 2. FIG. 14 illustrates some subpixels PXn disposed in first and second areas AA1 and AA2 in an outermost part of the display area DPA, on one side, in the first direction DR1, of the display device 10. To clearly show the relative arrangement of electrodes RME, FIG. 14 does not illustrate first banks BNL1 and second banks BNL2.

Referring to FIG. 14, the direction in which the electrodes RME of each subpixel PXn extend may be the same as the direction in which subpixels PXn of the same type, i.e., first-type subpixels PX #1 or second-type subpixels PX #2, are arranged. As already mentioned above, the electrodes RME of each subpixel PXn may be obtained by forming single electrode lines that extend in one direction and dividing each of the electrode lines in the subarea SA of each subpixel PXn after the arrangement of light-emitting elements ED. The electrode lines may extend from one side to the other side of the non-display area NDA and may be divided, in the subarea SA of each subpixel PXn, into the electrodes RME of each subpixel PXn.

The display device 10 may include different types of groups of subpixels PXn having different electrode configurations depending on the distribution of the inkjet printing devices IJH. As the different types of groups of subpixels PXn, i.e., the first-type subpixels PX #1 and the second-type subpixels PX #2, have different electrode configurations, the electrode lines may be formed in consideration of the arrangement of the first-type subpixels PX #1 and the second-type subpixels PX #2. Because subpixels of the same type, i.e., the first-type subpixels PX #1 or the second-type subpixels PX #2, may be arranged along the moving direction of the inkjet printing devices IJH, the electrode lines, which are for aligning light-emitting elements ED, may extend along the moving direction of the inkjet printing devices IJH. Accordingly, the direction in which the electrodes RME of each subpixel PXn may be the same as the direction in which the first-type subpixels PX #1 or the second-type subpixels PX #2 are arranged and the moving direction of the inkjet printing devices IJH.

As illustrated in FIG. 14, the electrodes RME of each of first-type subpixels PX #1 of a first pixel PXA in the first area AA1 and the electrodes RME of each of second-type subpixels PX #2 of a second pixel PXB in the second area AA2 may extend in the first direction DR1. The electrodes RME of each of first-type subpixels PX #1 that are arranged along the first direction DR1 may be obtained by forming electrode lines and then dividing the electrode lines in the subarea SA of each of the first-type subpixels PX #1. Similarly, the electrodes RME of each of second-type subpixels PX #2 that are arranged along the first direction DR1 may be obtained by forming electrode lines and then dividing the electrode lines in the subarea SA of each of the second-type subpixels PX #2. In a case where the display device 10 extends longer in the first direction DR1 than in the second direction DR2, as the inkjet printing devices IJH move in the first direction DR1, a plurality of electrodes RME may be disposed to extend in the first direction DR1.

Display devices according to other embodiments of the present disclosure will hereinafter be described.

Figure 15:
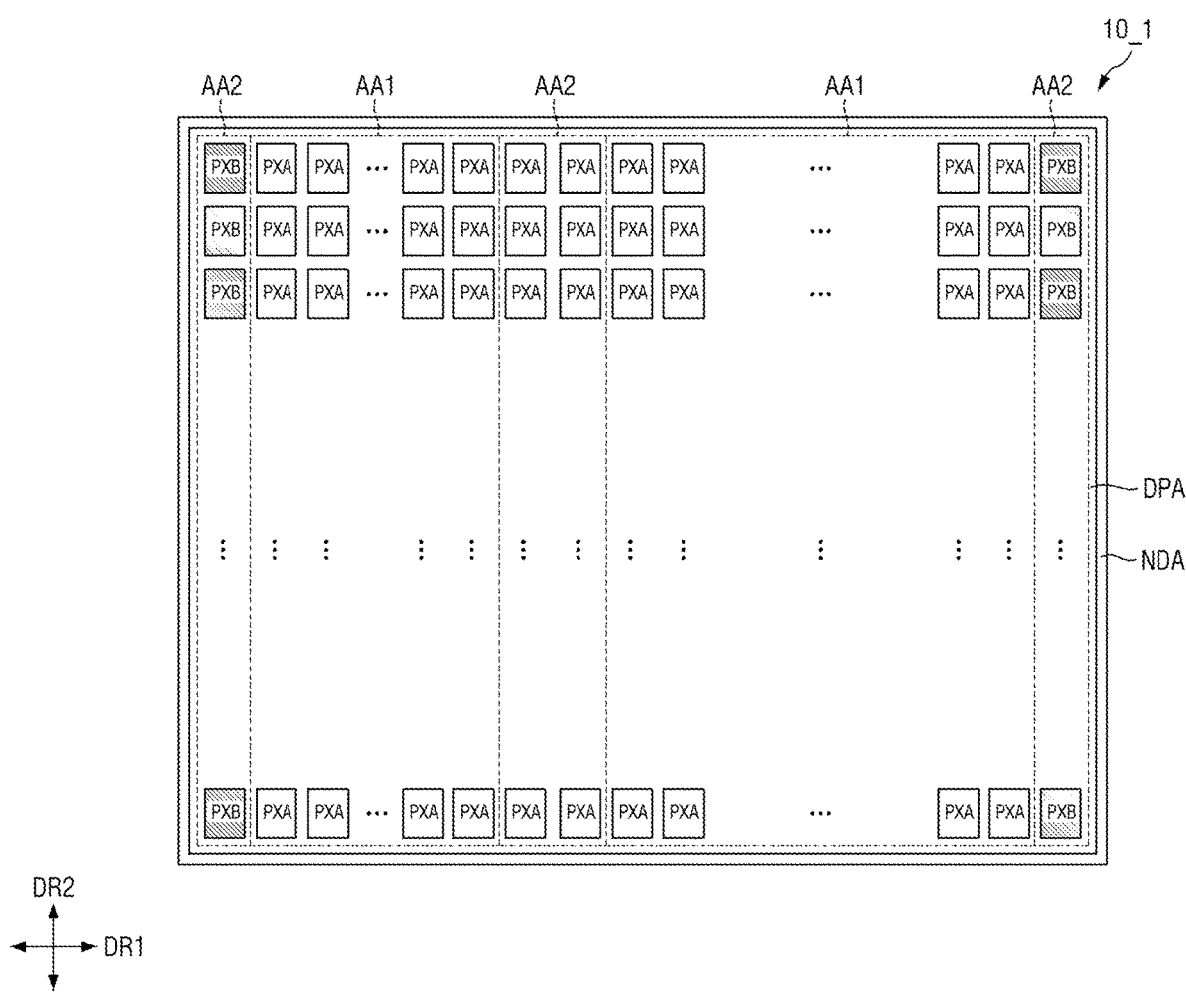
FIG. 15 is a layout view illustrating the arrangement of a plurality of pixels in the display area of a display device according to another embodiment of the present disclosure.
Figure 16:
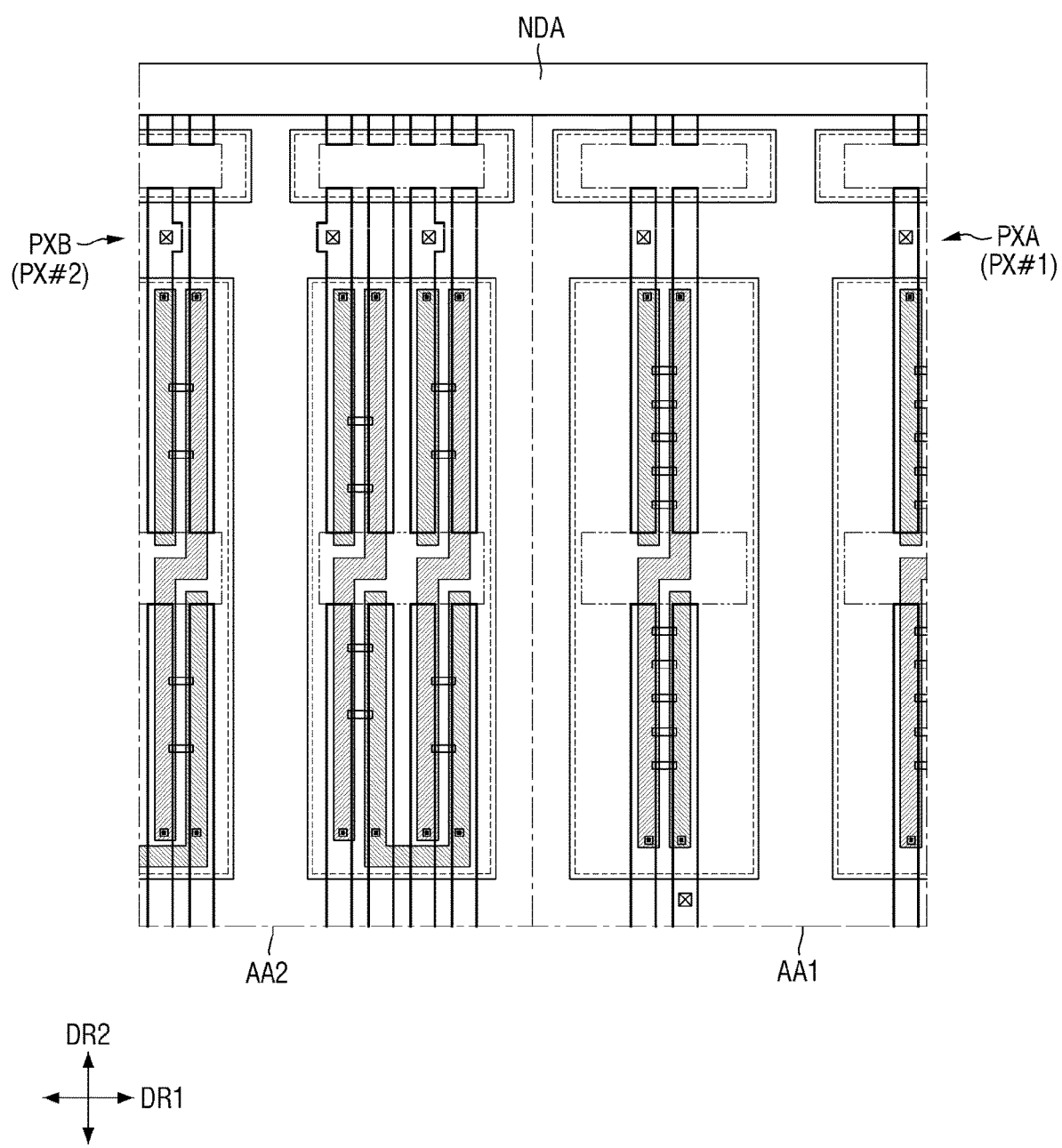
FIG. 16 is a layout view illustrating the arrangement of subpixels at the boundary between first and second areas of the display device of FIG. 15.

FIG. 15 is a layout view illustrating the arrangement of a plurality of pixels in the display area of a display device according to another embodiment of the present disclosure. FIG. 16 is a layout view illustrating the arrangement of subpixels at the boundary between first and second areas of the display device of FIG. 15. FIG. 16 illustrates some subpixels PXn in first and second areas AA1 and AA2 in an outermost part of a display area DPA, on one side, in a second direction DR2, of the display device of FIG. 15.

Referring to FIGS. 15 and 16, first areas AA1 and AA2 of a display device 10_1 may extend in the second direction DR2. The first pixel PXA, which includes first-type subpixels PX #1, and the second pixel PXB, which includes second-type subpixels PX #2, may be arranged in the same column in the second direction DR2, and the first and second areas AA1 and AA2 may be arranged along a first direction DR1. As already mentioned above, the locations of the first and second areas AA1 and AA2 and the arrangement of electrodes RME of each subpixel PXn may vary depending on the moving direction of inkjet printing devices IJH during the fabrication of the display device 10_1. The embodiment of FIGS. 15 and 16 differs from the embodiment of FIGS. 2 and 14 in the pattern of arrangement of the first-type subpixels PX #1 and the second-type subpixels PX #2. The embodiment of FIGS. 15 and 16 will hereinafter be described, focusing mainly on the differences with the embodiment of FIGS. 2 and 14.

In a case where the display device 10_1 extends longer in the first direction DR1 than in the second direction DR2, the inkjet printing devices IJH may spray ink while moving in the second direction DR2. Subpixels of the same type, i.e., the first-type subpixels PX #1 or the second-type subpixels PX #2, may be arranged along the second direction DR2 in accordance with the distribution of the inkjet printing devices IJH, and the first-type subpixels PX #1 and the second-type subpixels PX #2 may be disposed adjacent to one another in the first direction DR1.

As illustrated in FIG. 16, the electrodes RME of each of the first-type subpixels PX #1 of the first pixel PXA in the first area AA1 and the electrodes RME of each of the second-type subpixels PX #2 of the second pixel PXB in the second area AA2 may extend in the second direction DR2. The electrodes RME of each of first-type subpixels PX #1 that are arranged along the second direction DR2 may be obtained by forming electrode lines and then dividing the electrode lines in the subarea SA of each of the first-type subpixels PX #1. Similarly, the electrodes RME of each of second-type subpixels PX #2 that are arranged along the second direction DR2 may be obtained by forming electrode lines and then dividing the electrode lines in the subarea SA of each of the second-type subpixels PX #2. In a case where the display device 10 extends longer in the first direction DR1 than in the second direction DR2, as the inkjet printing devices IJH move in the second direction DR2, a plurality of electrodes RME may be disposed to extend in the second direction DR2, and the first and second areas AA1 and AA2 may extend in the second direction DR2.

Figure 17:
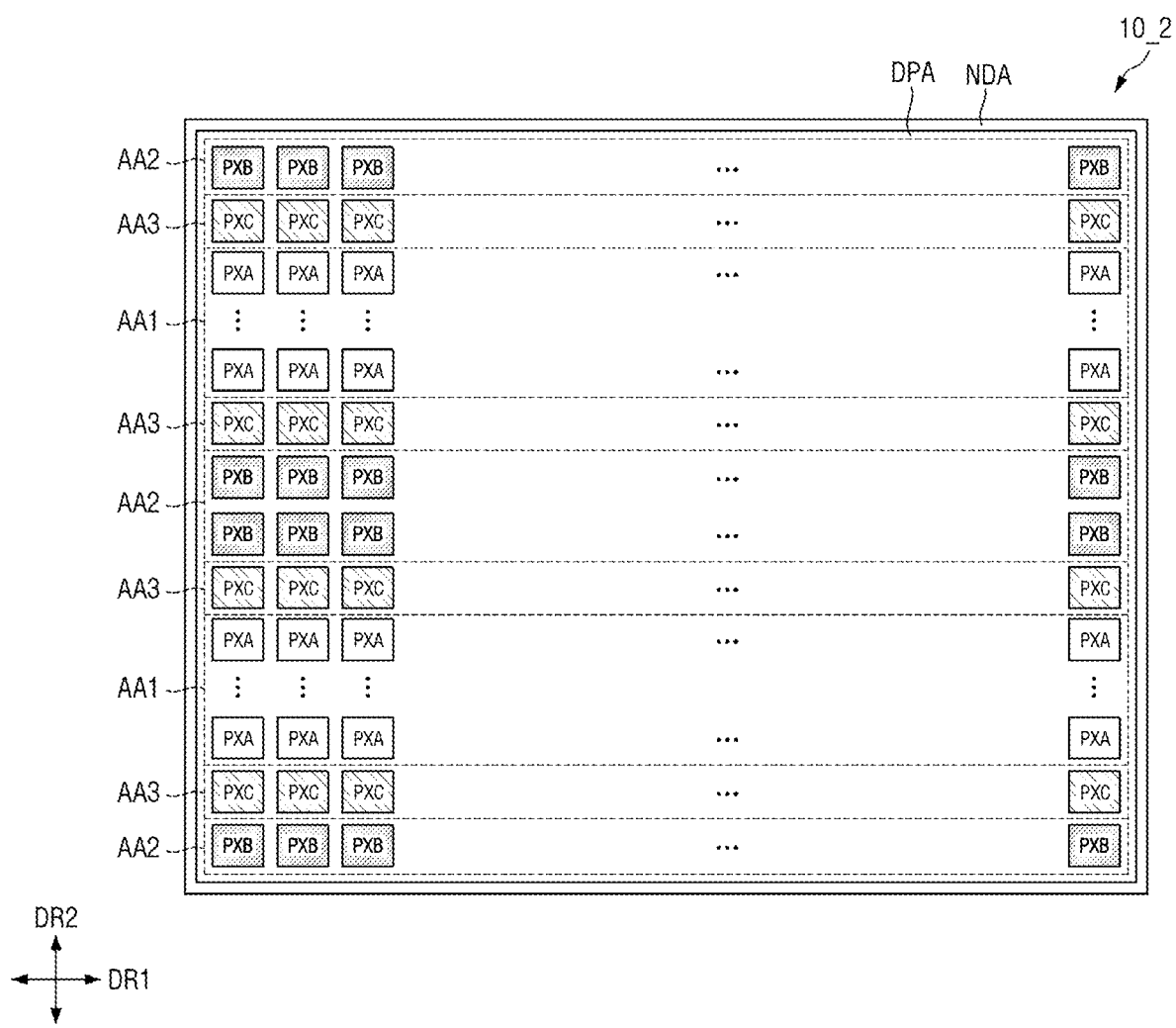
FIG. 17 is a layout view illustrating the arrangement of a plurality of pixels in the display area of a display device according to another embodiment of the present disclosure.
Figure 18:
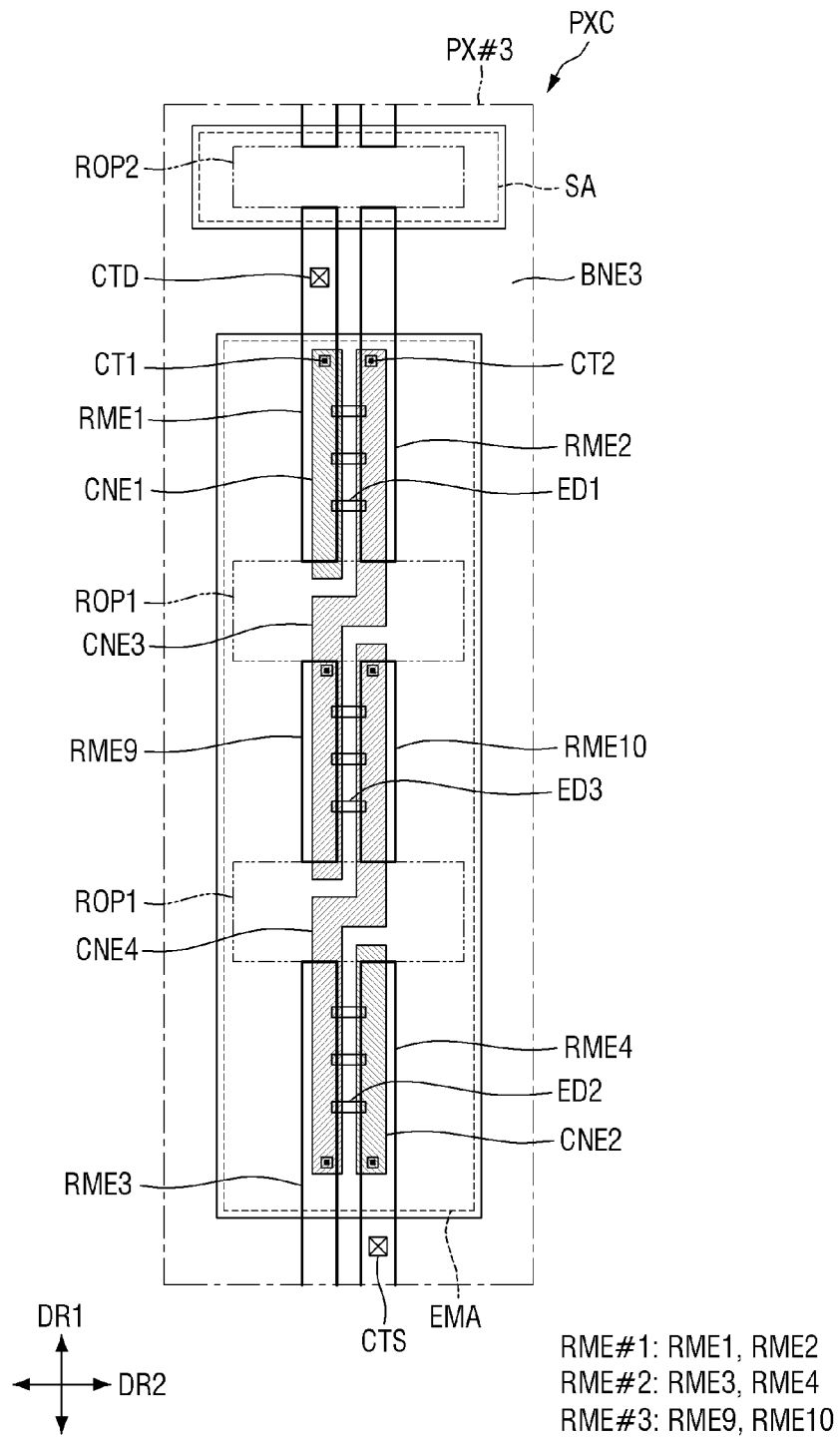
FIG. 18 is a plan view of a subpixel of a third pixel of the display device of FIG. 17.

FIG. 17 is a layout view illustrating the arrangement of a plurality of pixels in the display area of a display device according to another embodiment of the present disclosure. FIG. 18 is a plan view of a subpixel of a third pixel of the display device of FIG. 17. To clearly show the relative arrangement of electrodes RME, FIG. 18 does not illustrate first banks BNL1 and second banks BNL2.

Referring to FIGS. 17 and 18, a display device 10_2 may further include third areas AA3, which are disposed between first areas AA1 and second areas AA2 and in which subpixels PXn having a different electrode configuration from subpixels PXn disposed in the first areas AA1 or the second areas AA2 are disposed. The subpixels PXn disposed in the third areas AA3 may include third-type subpixels PX #3, which have a different electrode configuration and a different number of serial connections between light-emitting elements ED from first subpixels PX #1 disposed in the first areas AA1 and second-type subpixels PX #2 disposed in the second areas AA2. The embodiment of FIGS. 17 and 18 differs from the embodiment of FIG. 2 in that differences in luminance caused by the distribution of printing processes can be precisely corrected by providing the third areas AA3 between the first areas AA1 and the second areas AA2. The embodiment of FIGS. 17 and 18 will hereinafter be described, focusing mainly on the differences with the embodiment of FIG. 2, for example, the structures of the third areas AA3 and the third-type subpixels PX #3.

The third areas AA3 may be disposed between the first areas AA1 and the second areas AA2 to extend in a first direction DR1. The pixel rows of the first areas AA1 of FIG. 2 that are adjacent to the second areas AA2 may be formed as the third areas AA3. Accordingly, the second areas AA2, the third areas AA3, and the first areas AA1 may be arranged in a display area DPA along a second direction DR2. The first areas AA1 may be disposed between the third areas AA3 that are spaced from each other in the second direction DR2, and the second areas AA2 may also be disposed between the third areas AA3 that are spaced from each other in the second direction DR2. That is, the third areas AA3 may be disposed between the first areas AA1 and the second areas AA2.

Ink ejected from the middle nozzles of each of inkjet printing devices IJH, rather than from the outermost nozzles of each of the inkjet printing devices IJH, may be sprayed onto the third areas AA3, while ink ejected from the outermost nozzles of each of the inkjet printing devices IJH is sprayed onto the second areas AA2. Even if a plurality of inkjet printing devices IJH perform printing at the same time, the middle nozzles of one inkjet printing device IJH may not be adjacent to the middle nozzles of another inkjet printing device IJH. Thus, the third areas AA3 may have a smaller width, in the second direction DR2, than the second area AA2 in the middle of the display area DPA.

The third-type subpixels PX #3, which are disposed in the third areas AA3, may be provided to reduce the difference in luminance between the first-type subpixels PX #1 in the first areas AA1 and the second-type subpixels PX #2 in the second areas AA2. The third-type subpixels PX #3 may have a serial structure with more stages than the first-type subpixels PX #1 having a two-stage serial structure, but with fewer stages than the second-type subpixels PX #2 having a four-stage serial structure.

For example, the third-type subpixels PX #3 may include more electrodes RME than the first-type subpixels PX #1, but fewer electrodes RME than the second-type subpixels PX #2. The third-type subpixels PX #3 may include first and second electrode groups RME #1 and RME #2 and may further include a third electrode group RME #3, which is disposed between the first and second electrode groups RME #1 and RME #2.

The third electrode group RME #3 may include a ninth electrode RME9, which is disposed between first and third electrodes RME1 and RME3 and is spaced from the first and third electrodes RME1 and RME3 in the first direction DR1, and a tenth electrode RME10, which is disposed between second and fourth electrodes RME2 and RME4 and is spaced from the ninth electrode RME9 in the second direction DR2. Light-emitting elements ED may include first light-emitting elements ED1, which are disposed on the first electrode group RME #1, second light-emitting elements ED2, which are disposed on the second electrode group RME #2, and third light-emitting elements ED3, which are disposed on the third electrode group RME #3. The third-type subpixels PX #3 may include, per unit area of their emission area EMA, fewer light-emitting elements ED than the first-type subpixels PX #1, but more light-emitting elements ED than the second-type subpixels PX #2.

Contact electrodes CNE may include first and second contact electrodes CNE1 and CNE2, which are first-type contact electrodes, and may further include a third contact electrode CNE3, which is a second-type contact electrode and is disposed on the second and ninth electrodes RME2 and RME9, and a fourth contact electrode CNE4, which is a second-type contact electrode and is disposed on the third and tenth electrodes RME3 and RME10. The first light-emitting elements ED1, the second light-emitting elements ED2, and the third light-emitting elements ED3 may be connected in series via the third and fourth contact electrodes CNE3 and CNE4. The third-type subpixels PX #3 may include more electrodes RME than the first-type subpixels PX #1 and may have a three-stage serial structure. As the display device 10_2 further includes the third areas AA3, in which the third-type subpixels PX #3 are arranged, the difference in luminance between the first areas AA1 and the second areas AA2 may arise in stages, and the luminance of the display area DPA can be uniformly controlled by correcting the luminances of the first areas AA1, the second areas AA2, and the third areas AA3.

Figure 19:
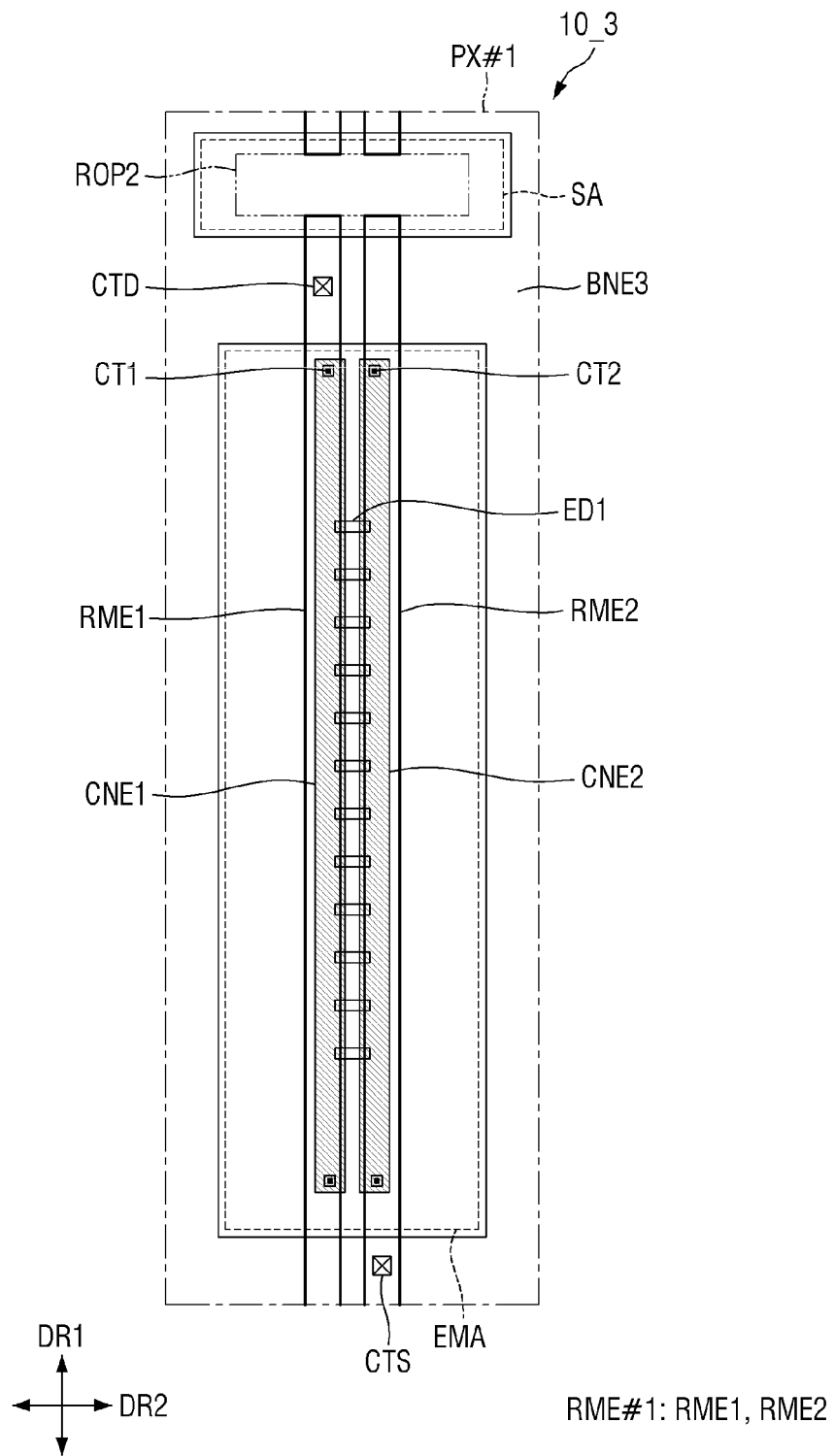
FIG. 19 is a plan view of a subpixel of a first pixel of a display device according to another embodiment of the present disclosure.
Figure 20:
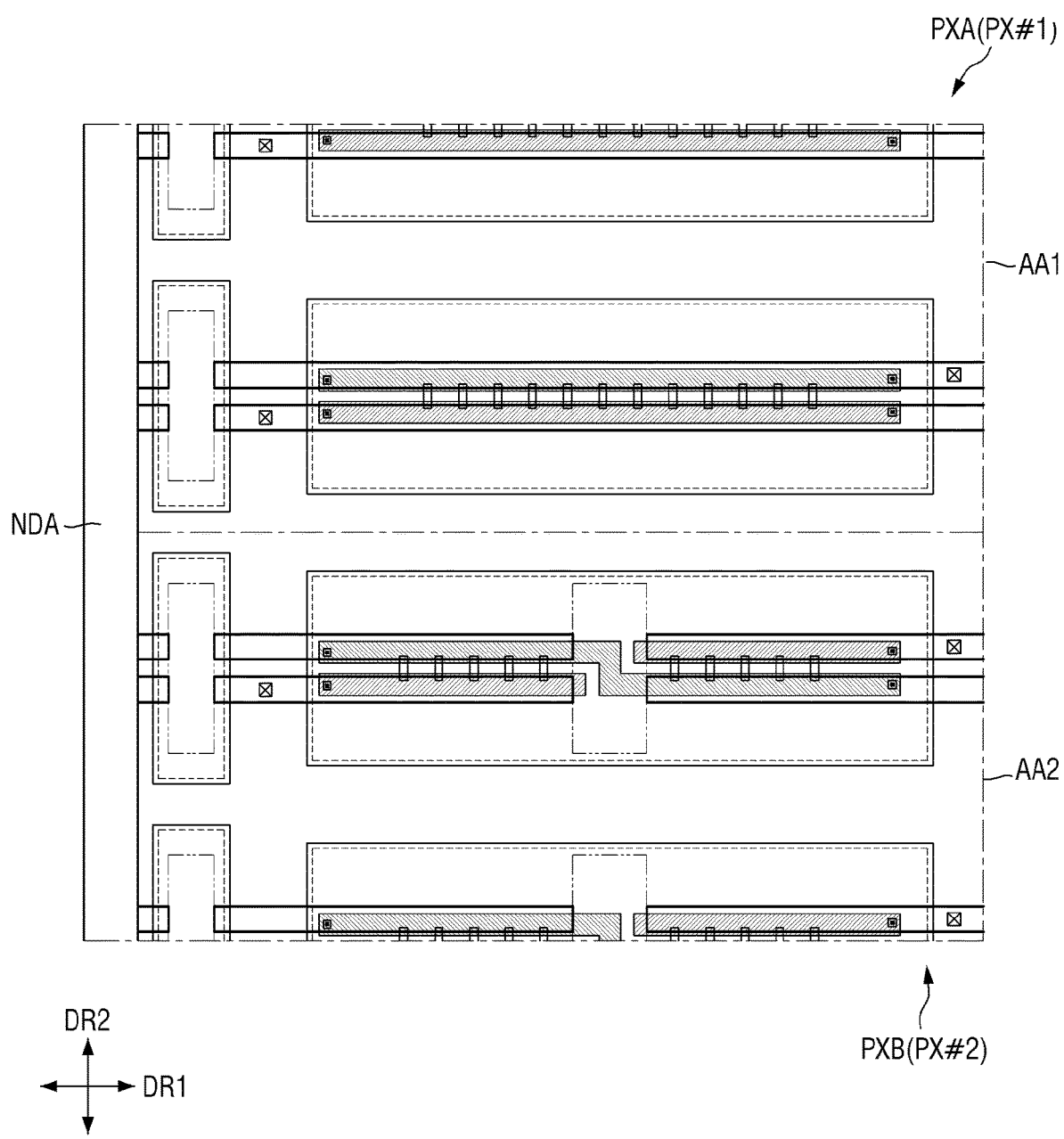
FIG. 20 is a layout view illustrating the arrangement of subpixels at the boundary between first and second areas of the display device of FIG. 19.

FIG. 19 is a plan view of a subpixel of a first pixel of a display device according to another embodiment of the present disclosure. FIG. 20 is a layout view illustrating the arrangement of subpixels at the boundary between first and second areas of the display device of FIG. 19. To clearly show the relative arrangement of electrodes RME, FIG. 19 does not illustrate first banks BNL1 and second banks BNL2.

Referring to FIGS. 19 and 20, first-type subpixels PX #1 of a display device 10_3 may include fewer electrodes RME than the first-type subpixel PX #1 of FIG. 5. Each of the first-type subpixels PX #1 may include first and second electrodes RME1 and RME2, but not third and fourth electrodes RME3 and RME4. Each of the first-type subpixels PX #1 may include first and second contact electrodes CNE1 and CNE2, which are disposed on the first and second electrodes RME1 and RME2, respectively, and a plurality of light-emitting elements ED of each of the first-type subpixels PX #1 may have a one-stage serial structure.

Second-type subpixels PX #2 of the display device 10_3 may have the same structure as the subpixel PXn of FIG. 5. The display device 10_3 may include a first area AA1, in which the first-type subpixels PX #1 having a one-stage serial structure are arranged, and a second area AA2, in which the second-type subpixels PX #2 having a two-stage serial structure are arranged. The first-type subpixels PX #1 may include fewer electrodes RME, but more light-emitting elements ED per unit area of their emission area EMA, than the second-type subpixels PX #2. The embodiment of FIGS. 19 and 20 differs from the embodiment of FIGS. 5 and 8 in that the first-type subpixels PX #1 and the second-type subpixels PX #2 include a one-stage serial structure and a two-stage serial structure, respectively.

Figure 21:
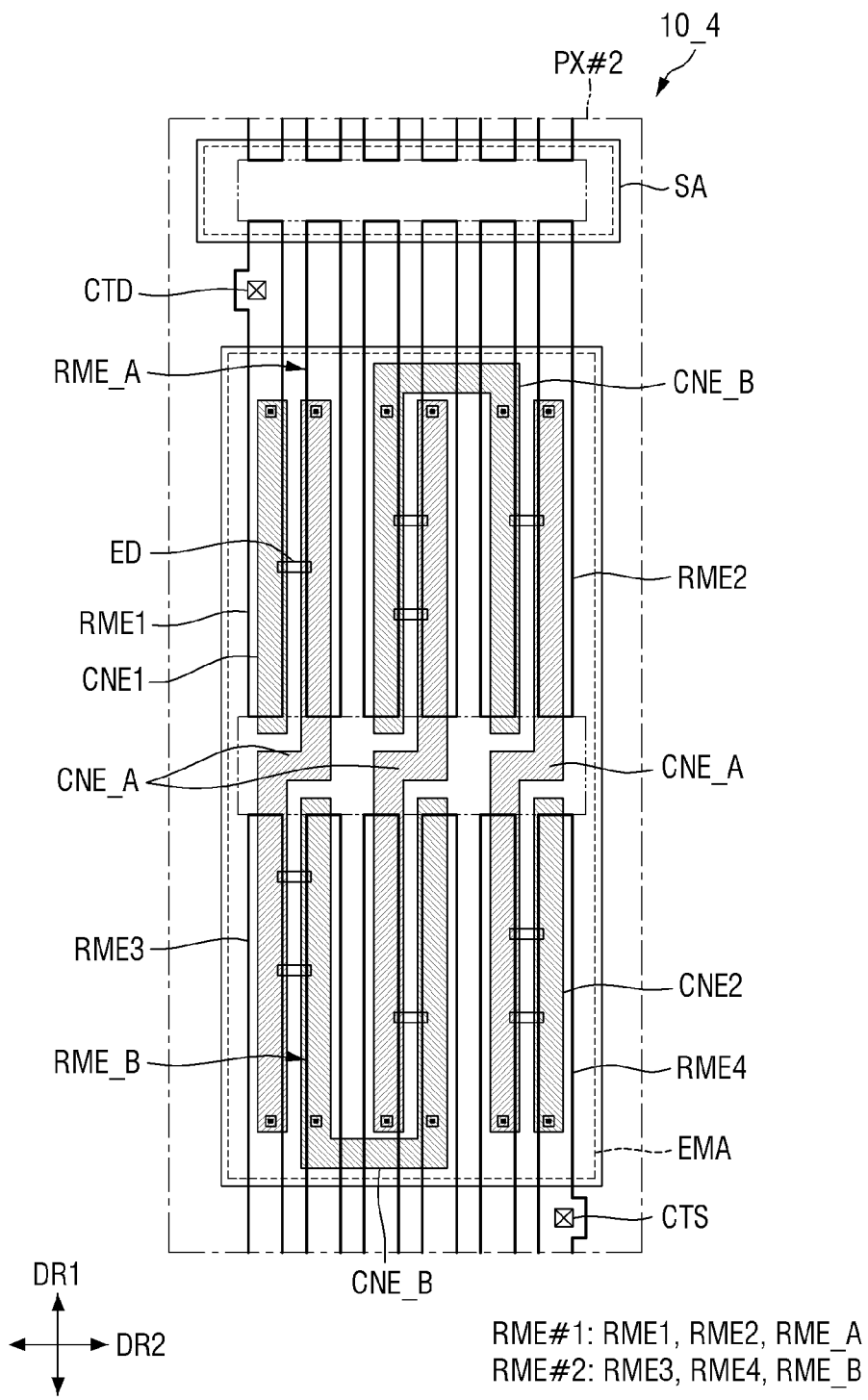
FIG. 21 is a plan view of a subpixel of a second pixel of a display device according to another embodiment of the present disclosure.
Figure 22:
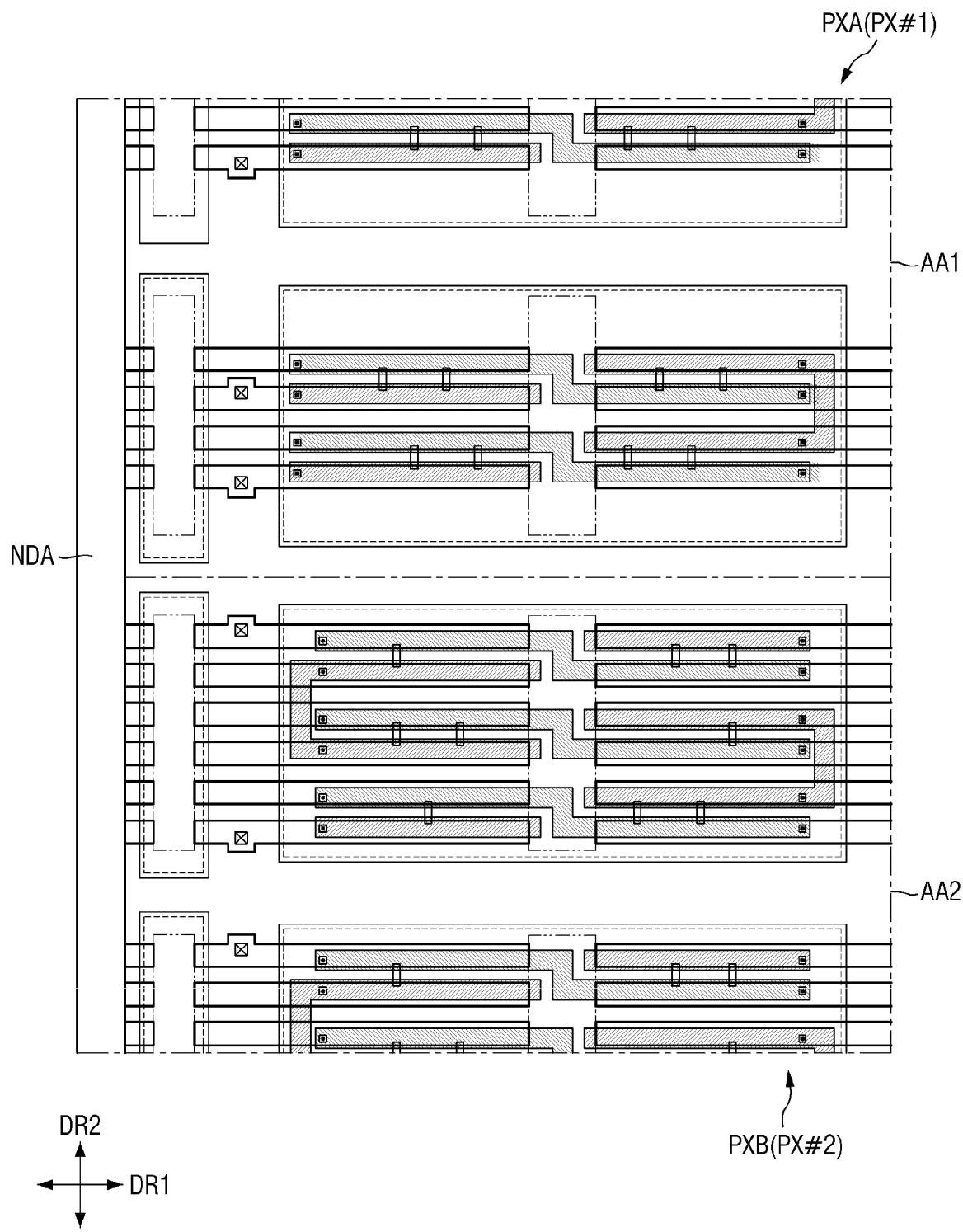
FIG. 22 is a layout view illustrating the arrangement of subpixels at the boundary between first and second areas of the display device of FIG. 21.

FIG. 21 is a plan view of a subpixel of a second pixel of a display device according to another embodiment of the present disclosure. FIG. 22 is a layout view illustrating the arrangement of subpixels at the boundary between first and second areas of the display device of FIG. 21. To clearly show the relative arrangement of electrodes RME, FIG. 21 does not illustrate first banks BNL1 and second banks BNL2.

Referring to FIGS. 21 and 22, second-type subpixels PX #2 of a display device 10_4 may include more electrodes RME than the second-type subpixel PX #2 of FIG. 8. Each of the second-type subpixels PX #2 may include first and second electrode groups RME #1 and RME #2, and each of the first and second electrode groups RME #1 and RME #2 may include a plurality of upper electrodes RME_A and a plurality of lower electrodes RME_B. The first electrode group RME #1 may include first and second electrodes RME1 and RME2 and four upper electrodes RME_A, which are disposed between the first and second electrodes RME1 and RME2, and the second electrode group RME #2 may include third and fourth electrodes RME3 and RME4 and four lower electrodes RME_B, which are disposed between the third and fourth electrodes RME3 and RME4. Accordingly, a total of 12 electrodes RME may be disposed in the emission area EMA of each of the second-type subpixels PX #2.

Contact electrodes CNE may include first and second contact electrodes CNE1 and CNE2, which are disposed on the first and fourth electrodes RME1 and RME4, respectively, and a plurality of contact electrodes CNE_A, which are disposed on the first and second electrode groups RME #1 and RME #2, and a plurality of contact electrodes CNE_B, which are disposed on the first and second electrode groups RME #1 and RME #2. Each of the second-type subpixels PX #2 may include relatively large numbers of electrodes RME and contact electrodes CNE, and a plurality of light-emitting elements ED of each of the second-type subpixels PX #2 may have a six-stage serial structure.

First-type subpixels PX #1 of the display device 10_4 may have the same structure as the subpixel PXn of FIG. 8. The display device 10_4 may include a first area AA1, in which the first-type subpixels PX #1 having a four-stage serial structure are arranged, and a second area AA2, in which the second-type subpixels PX #2 having a six-stage serial structure are arranged. The second-type subpixels PX #2 may include more electrodes RME, but fewer light-emitting elements ED per unit area of their emission area EMA, than the first-type subpixels PX #1. The embodiment of FIGS. 21 and 22 differs from the embodiment of FIGS. 5 and 8 in that the first-type subpixels PX #1 and the second-type subpixels PX #2 have a four-stage serial structure and a six-stage serial structure, respectively.

Figure 23:
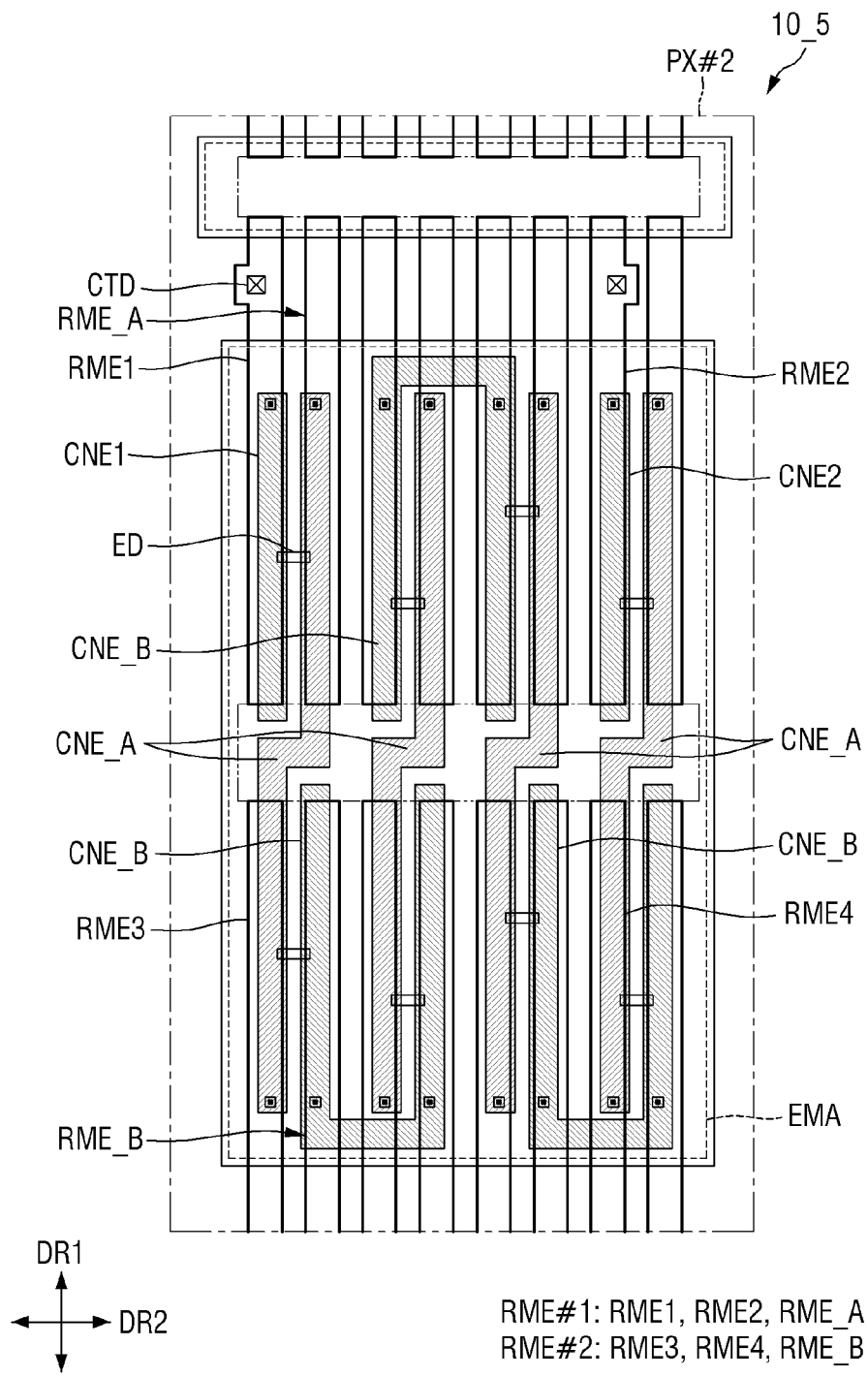
FIG. 23 is a plan view of a subpixel of a display device according to another embodiment of the present disclosure.

FIG. 23 is a plan view of a subpixel of a display device according to another embodiment of the present disclosure. To clearly show the relative arrangement of electrodes RME, FIG. 23 does not illustrate first banks BNL1 and second banks BNL2.

Referring to FIG. 23, each of second-type subpixels PX #2 of a display device 10_5 may include more electrodes RME than the second-type subpixel PX #2 of FIG. 21.

Each of the second-type subpixels PX #2 may include first and second electrode groups RME #1 and RME #2, the first electrode group RME #1 may include first and second electrodes RME1 and RME2, five upper electrodes RME_A disposed between the first and second electrodes RME1 and RME2, and one upper electrode RME_A spaced from the second electrode RME2, and the second electrode group RME #2 may include third and fourth electrodes RME3 and RME4, five lower electrodes RME_B disposed between the third and fourth electrodes RME3 and RME4, and one lower electrode RME_B spaced from the fourth electrode RME4. Accordingly, a total of 16 electrodes RME may be disposed in the emission area EMA of each of the second-type subpixels PX #2.

Contact electrodes CNE may include first and second contact electrodes CNE1 and CNE2, which are disposed on the first and second electrodes RME1 and RME2, respectively, and a plurality of contact electrodes CNE_A, which are disposed on the first and second electrode groups RME #1 and RME #2, and a plurality of contact electrodes CNE_B, which are disposed on the first and second electrode groups RME #1 and RME #2. The second-type subpixel PX #2 may include relatively large numbers of electrodes RME and contact electrodes CNE, and a plurality of light-emitting elements ED of each of the second-type subpixels PX #2 may have an eight-stage serial structure.

First-type subpixels PX #1 of the display device 10_5 may have the same structure as the subpixel PXn of FIG. 21. The display device 10_5 may include a first area AA1, in which the first-type subpixels PX #1 having a six-stage serial structure are arranged, and a second area AA2, in which the second-type subpixels PX #2 having an eight-stage serial structure are arranged. The second-type subpixels PX #2 may include more electrodes RME, but fewer light-emitting elements ED per unit area of their emission area EMA, than the first-type subpixels PX #1. The embodiment of FIG. 23 differs from the embodiment of FIG. 21 in that the first-type subpixels PX #1 and the second-type subpixels PX #2 have a six-stage serial structure and an eight-stage serial structure, respectively.

In some embodiments, each pixel PX may include three subpixels PXn, and in the above-described embodiments, three subpixels of the same type, i.e., three first-type subpixels PX #1 or three second-type subpixels PX #2, may form a single pixel, i.e., a first pixel PXA or a second pixel PXB. However, the present disclosure is not limited to the above-described embodiments. Alternatively, each pixel PX may consist of different types of subpixels PXn.

Figure 24:
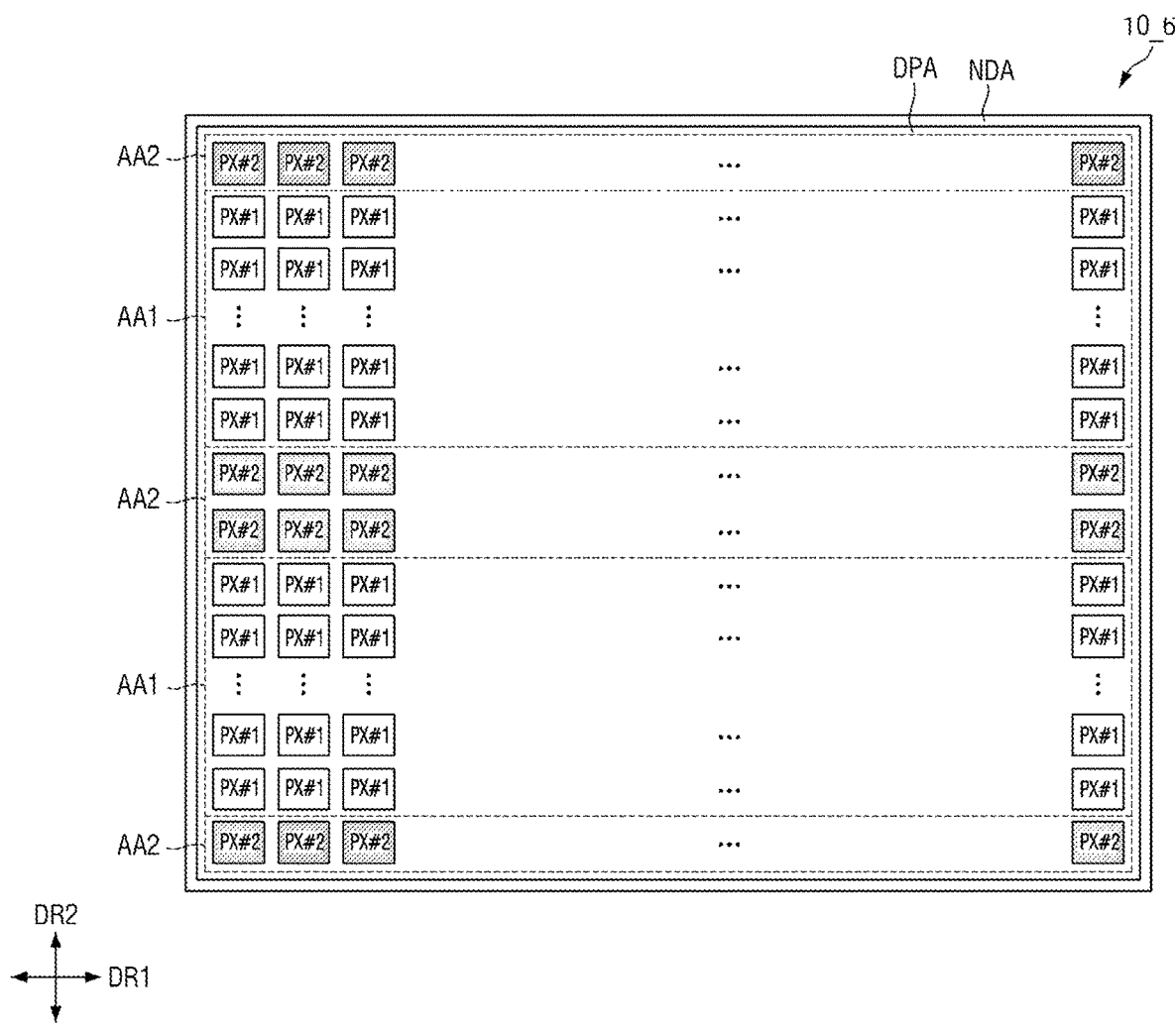
FIG. 24 is a layout view illustrating the arrangement of a plurality of pixels in the display area of a display device according to another embodiment of the present disclosure.
Figure 25:
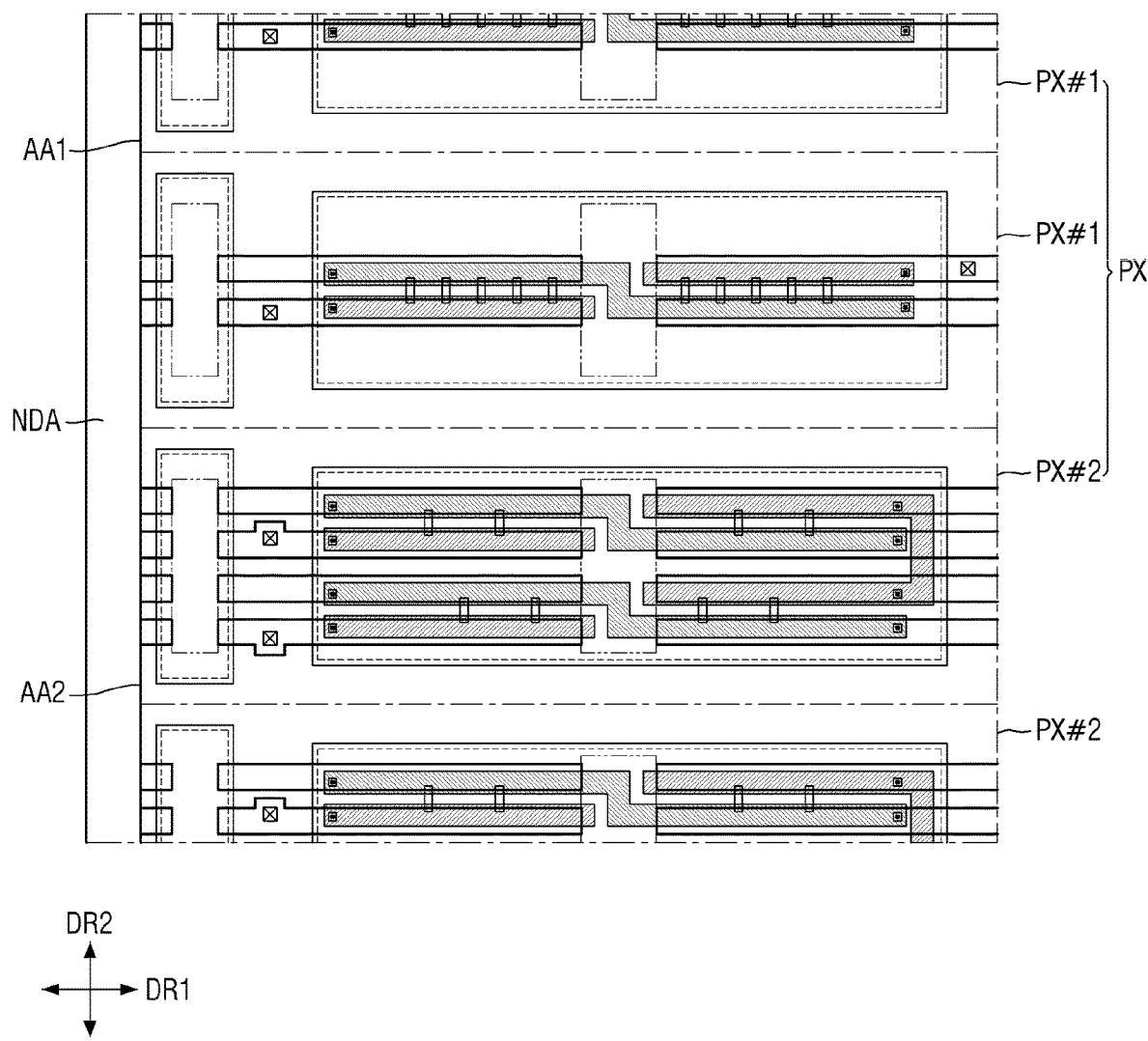
FIG. 25 is a layout view illustrating the arrangement of subpixels at the boundary between first and second areas of the display device of FIG. 24.

FIG. 24 is a layout view illustrating the arrangement of a plurality of pixels in the display area of a display device according to another embodiment of the present disclosure. FIG. 25 is a layout view illustrating the arrangement of subpixels at the boundary between first and second areas of the display device of FIG. 24.

Referring to FIGS. 24 and 25, a display area DPA of a display device 10_6 may be classified into first areas AA1 and second areas AA2 defined depending on whether first-type subpixels PX #1 or second-type subpixels PX #2 are arranged therein, and each pixel PX may include different types of subpixels PXn. The first areas AA1 and the second areas AA2 may be differentiated from one another by the type of subpixels PXn disposed therein. Each pixel PX, unlike its counterpart of FIG. 2, may include different types of subpixels.

Referring again to FIG. 2, three first-type subpixels PX #1 may form a single first pixel PXA, and only first pixels PXA may be arranged in the first areas AA1. Also, referring again to FIG. 2, three second-type subpixels PX #2 may form a single second pixel PXB, and only second pixels PXB may be arranged in the second areas AA2. On the contrary, referring to FIGS. 24 and 25, two first-type subpixels PX #1 and one second-type subpixel PX #2 may form a single pixel PX, and such pixels PX may be arranged in both the first areas AA1 and the second areas AA2. The electrode configuration of each of the subpixels PXn of the display device 10_6 may be designed in consideration of the distribution of printing processes during the fabrication of the display device 10_6. The structure of electrodes RME may vary depending on the distribution of printing processes with respect to each subpixel PXn, rather than with respect to each pixel PX. Accordingly, the display device 10_6 may include a plurality of pixels PX each having different types of subpixels. In this case, the correction of luminance, which can be controlled based on the number of serial connections between light-emitting elements ED in each of subpixels PXn of each of the pixels PX, may be performed not only on the pixels PX, but also on the subpixels PXn of each of the pixels PX.

In concluding the detailed description, those skilled in the art will appreciate that many variations and modifications can be made to the disclosed embodiments without substantially departing from the principles of the present disclosure. Therefore, the disclosed embodiments of the present disclosure are used in a generic and descriptive sense only and not for purposes of limitation. The scope of the present disclosure may be defined by the following claims, and equivalents thereof.

What is claimed is:

1. A display device comprising:
a plurality of subpixels arranged along a first direction and a second direction crossing the first direction,
wherein each of the subpixels comprises an emission area, a plurality of electrodes located in the emission area, extending in the first direction and spaced from one another in the second direction, and a plurality of light-emitting elements located on the electrodes spaced from one another in the second direction, and
wherein the subpixels comprise a plurality of first-type subpixels and a plurality of second-type subpixels, the second-type subpixels having a different number of electrodes in the emission areas from the first-type subpixels.

2. The display device of claim 1, wherein the first-type subpixels include more light-emitting elements per unit area of the emission area and fewer electrodes in the emission area than the second-type subpixels.

3. The display device of claim 2, further comprising:
a plurality of first areas, in which the first-type subpixels are arranged along the first and second directions; and
a plurality of second areas adjacent to the first areas, the second-type subpixels being arranged along the first and second directions in the second areas,
wherein the first areas and the second areas have a same length in the first direction.

4. The display device of claim 3, wherein
the first areas and the second areas are alternately arranged along the second direction, and
a distance, in the second direction, between the second areas is uniform.

5. The display device of claim 4, wherein at least some of the second areas have a smaller width than other ones of the second areas in the second direction.

6. The display device of claim 3, wherein
each of the subpixels further comprises a subarea spaced from the emission area in the first direction, and
the electrodes of each of the subpixels arranged along the first direction are separately located in the subarea of a corresponding one of the subpixels.

7. The display device of claim 2, further comprising:
a plurality of first pixels, each of the plurality of first pixels comprising two or more of the first-type subpixels; and
a plurality of second pixels, each of the plurality of second pixels comprising two or more of the second-type subpixels,
wherein
the first pixels are arranged along the first direction, and
the second pixels are arranged along the first direction.

8. The display device of claim 1, wherein
each of the first-type subpixels comprises a first electrode, a second electrode spaced from the first electrode in the second direction, and first light-emitting elements located on the first and second electrodes, and
each of the second-type subpixels comprises a third electrode spaced from the first electrode in the first direction, a fourth electrode spaced from the second electrode in the first direction, and second light-emitting elements located on the third and fourth electrodes.

9. The display device of claim 8, wherein
each of the first-type subpixels further comprises a first contact electrode on the first electrode and a second contact electrode on the second electrode,
the first contact electrode is in contact with first end portions of the first light-emitting elements, and
the second contact electrode is in contact with second end portions of the first light-emitting elements.

10. The display device of claim 8, wherein
each of the second-type subpixels further comprises a first contact electrode on the first electrode, a second contact electrode on the fourth electrode, and a third contact electrode on the third electrode, and
the first contact electrode is in contact with first end portions of the first light-emitting elements,
the third contact electrode is in contact with second end portions of the first light-emitting elements and first end portions of the second light-emitting elements, and
the second contact electrode is in contact with second end portions of the second light-emitting elements.

11. The display device of claim 1, wherein
each of the subpixels comprises a first electrode, a second electrode spaced from the first electrode in the second direction, a third electrode spaced from the first electrode in the first direction, and a fourth electrode spaced from the second electrode in the first direction, and
each of the second-type subpixels further comprises a fifth electrode between the first electrode and the second electrode, a sixth electrode spaced from the second electrode in the second direction, a seventh electrode spaced from the fifth electrode in the first direction, and an eighth electrode spaced from the sixth electrode in the first direction.

12. The display device of claim 11, wherein each of the first-type subpixels further comprises first light-emitting elements located on the first electrode and the second electrode, second light-emitting elements located on the third electrode and the fourth electrode, and a first contact electrode and a second contact electrode located on the first electrode and the second electrode, respectively.

13. The display device of claim 11, wherein each of the second-type subpixels further comprises first light-emitting elements located on the first electrode and the fifth electrode,
second light-emitting elements located on the second electrode and the sixth electrode,
third light-emitting elements located on the third electrode and the seventh electrode,
fourth light-emitting elements located on the fourth electrode and the eighth electrode,
a first contact electrode on the first electrode and a second contact electrode on the second electrode,
a third contact electrode on the third electrode and the fifth electrode,
a fourth contact electrode on the seventh electrode and the eighth electrode, and
a fifth contact electrode on the fourth electrode and the sixth electrode.

14. The display device of claim 11, wherein
the subpixels further comprise third-type subpixels, and
each of the third-type subpixels comprises a ninth electrode between the first electrode and the third electrode, and a tenth electrode spaced from the ninth electrode in the second direction and located between the second electrode and the fourth electrode.

15. A display device comprising:
a display area in which a plurality of pixels comprising a plurality of subpixels is located; and
a non-display area surrounding the display area, wherein
each of the subpixels comprises a first electrode group comprising a plurality of electrodes extending in a first direction and spaced apart from one another in a second direction crossing the first direction,
a second electrode group spaced from the first electrode group in the first direction and comprising a plurality of electrodes spaced from one another in the second direction, and
a plurality of light-emitting elements located on the electrodes and spaced from one another in the first direction,
wherein the pixels comprise a plurality of first pixels and a plurality of second pixels having a different number of electrodes located in each of the subpixels from the first pixels, and
wherein the display area comprises a plurality of first areas in which the first pixels are located, and a plurality of second areas in which the second pixels are located.

16. The display device of claim 15, wherein
each of the subpixels further comprises an emission area in which the light-emitting elements and the electrodes are located,
the first pixels have more light-emitting elements per unit area of the emission area and fewer electrodes in the emission area than the second pixels.

17. The display device of claim 15, wherein
the first areas and the second areas extend in the first direction and are alternately arranged in the second direction, and
the first areas and the second areas have a same length in the first direction.

18. The display device of claim 17, wherein
the first areas are located between second areas spaced from each other in the second direction, and
a distance, in the second direction, between the second areas is uniform.

19. The display device of claim 18, wherein a width of first ones of the second areas in outermost parts, in the second direction, of the display area is smaller than a width of second ones of the second areas in middle of the display area.

20. The display device of claim 18, wherein the display area further comprises third areas between the first areas and the second areas and in which third pixels having a different number of electrodes in each of the subpixels from the first pixels and the second pixels are located.

* * * * *